(12) United States Patent
Yoo et al.

(10) Patent No.: US 12,495,631 B2
(45) Date of Patent: Dec. 9, 2025

(54) IMAGE SENSOR INCLUDING SIMPLIFIED STRUCTURE FOR HORIZONTAL INSULATING LAYER

(71) Applicant: SAMSUNG ELECTRONICS CO., LTD., Suwon-si (KR)

(72) Inventors: Jaesang Yoo, Seongnam-si (KR); Dohoon Kim, Yongin-si (KR); Seokjong Kim, Gwangmyeong-si (KR); Sungkyoo Park, Seongnam-si (KR); Sangil Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 645 days.

(21) Appl. No.: 17/710,296

(22) Filed: Mar. 31, 2022

(65) Prior Publication Data
US 2023/0009280 A1   Jan. 12, 2023

(30) Foreign Application Priority Data

Jul. 6, 2021 (KR) .................. 10-2021-0088422
Sep. 3, 2021 (KR) .................. 10-2021-0117605

(51) Int. Cl.
  *H10F 39/00*   (2025.01)
  *H10F 39/18*   (2025.01)
(52) U.S. Cl.
  CPC .......... *H10F 39/807* (2025.01); *H10F 39/18* (2025.01); *H10F 39/8053* (2025.01)

(58) Field of Classification Search
  CPC .......... H01L 27/1463; H01L 27/14621; H01L 27/14643
  See application file for complete search history.

(56) References Cited

U.S. PATENT DOCUMENTS

| | | | |
|---|---|---|---|
| 9,673,239 B1 | 6/2017 | Chu et al. | |
| 2013/0299886 A1 | 11/2013 | Chuang et al. | |
| 2014/0138785 A1* | 5/2014 | Pralle ................... | H10F 39/182 |
| | | | 257/432 |
| 2016/0276394 A1* | 9/2016 | Chou .................... | H10F 39/811 |
| 2017/0263657 A1* | 9/2017 | Chu ...................... | H10F 39/805 |
| 2019/0131329 A1* | 5/2019 | Wu ....................... | H10F 39/199 |
| 2019/0229140 A1 | 7/2019 | Naito et al. | |
| 2020/0083268 A1* | 3/2020 | Kim ..................... | H10F 39/024 |
| 2020/0135798 A1 | 4/2020 | Tsao et al. | |
| 2021/0036179 A1 | 2/2021 | Sung et al. | |

FOREIGN PATENT DOCUMENTS

JP   2014-165332 A   9/2014

* cited by examiner

*Primary Examiner* — Norman D Richards
*Assistant Examiner* — Ethan Edward Cutler
(74) *Attorney, Agent, or Firm* — Sughrue Mion, PLLC

(57) ABSTRACT

An image sensor includes a substrate including a plurality of photodiodes, a color filter array having a plurality of color filters, and a horizontal insulating layer disposed between the substrate and the color filter array, and a horizontal insulating layer is formed of only a high-K dielectric material, not including silicon, and having a dielectric constant higher than a dielectric constant of silicon oxide, and has a thickness of equal to or greater than 300 angstroms and equal to or less than 1,000.

20 Claims, 22 Drawing Sheets

IMAGE SENSOR INCLUDING SIMPLIFIED STRUCTURE FOR HORIZONTAL INSULATING LAYER

CROSS-REFERENCE TO RELATED APPLICATION(S)

This application is based on and claims priority to Korean Patent Application Nos. 10-2021-0088422, filed on Jul. 6, 2021, and 10-2021-0117605, filed on Sep. 3, 2021, in the Korean Intellectual Property Office, the disclosures of which are incorporated herein by reference in their entireties.

BACKGROUND

The present disclosure relates to an image sensor.

An image sensor is a semiconductor-based sensor that receives light to generate an electrical signal therefrom, and may include a pixel array having a plurality of pixels, logic circuits that drive the pixel array and generate an image, and the like. Recently, to improve performance of an image sensor, the number of pixels included in a pixel array tends to increase and a size of each of the pixels tends to decrease. Accordingly, an effect of crosstalk between pixels on the performance of the image sensor may be increased.

SUMMARY

Example embodiments provide an image sensor which may significantly reduce optical crosstalk between pixels and may suppress generation of a white spot to improve a dark level.

According to an aspect of an example embodiment, there is provided an image sensor including: a substrate; a pixel array including: a plurality of photodiodes disposed in the substrate on a plurality of pixel regions defined in the substrate, the plurality of pixel regions being arranged in a first direction and a second direction that are parallel to an upper surface of the substrate; and a plurality of color filters disposed on the substrate on the plurality of pixel regions; and a logic circuit configured to obtain a pixel signal from the pixel array, wherein the pixel array includes a pixel isolation layer disposed between the plurality of photodiodes, a filter isolation layer disposed between the plurality of color filters, and a horizontal insulating layer disposed between the substrate and the plurality of color filters, wherein the horizontal insulating layer includes a first insulating layer in contact with the substrate and the pixel isolation layer, and a second insulating layer disposed on the first insulating layer, the second insulating layer having a thickness greater than a thickness of the first insulating layer, and wherein the horizontal insulating layer has a thickness equal to or greater than 300 angstroms and equal to or less than 1,000 angstroms, and each material of at least one material included in the horizontal insulating layer has a dielectric constant higher than a dielectric constant of silicon oxide.

According to an aspect of an example embodiment, there is provided an image sensor including: a substrate; a pixel array including: a plurality of photodiodes arranged in a first direction and a second direction, parallel to an upper surface of the substrate; a plurality of color filters disposed on a first surface of the substrate; and a pixel circuit region disposed on a second surface of the substrate; and a logic circuit configured to obtain a pixel signal from the pixel circuit region, wherein the pixel array includes a pixel isolation layer, disposed between the plurality of photodiodes, and a filter isolation layer disposed between the plurality of color filters, wherein a distance between the pixel isolation layer and the filter isolation layer is equal to or greater than 300 angstroms and equal to or less than 1,000 angstroms, and wherein a horizontal insulating layer including two or more high-K dielectric materials is disposed between the pixel isolation layer and the filter isolation layer, and each of the two or more high-K dielectric materials included in the horizontal insulating layer is a silicon-free material.

According to an aspect of an example embodiment, there is provided an image sensor including: a color filter array including a plurality of color filters arranged in a first direction and a second direction, the plurality of color filters being isolated from each other by a filter isolation layer; a substrate disposed below the color filter array, the substrate including a plurality of photodiodes, arranged in the first direction and the second direction, the plurality of photodiodes being isolated from each other by a pixel isolation layer; and a horizontal insulating layer disposed between the substrate and the color filter array, the horizontal insulating layer including a first insulating layer disposed to be in contact with the substrate, and a second insulating layer disposed to be in contact with the plurality of color filters, wherein the first insulating layer has a first thickness and includes a first high-K dielectric material, and the second insulating layer has a second thickness and includes a second high-K dielectric material, and wherein a thickness of the horizontal insulating layer between the pixel isolation layer and the filter isolation layer is different from a thickness of the horizontal insulating layer between the substrate and at least one of the plurality of color filters.

BRIEF DESCRIPTION OF DRAWINGS

The above and/or other aspects will become apparent and more readily appreciated from the following description of example embodiments, taken in conjunction with the accompanying drawings in which.

DETAILED DESCRIPTION

Hereinafter, example embodiments will be described with reference to the accompanying drawings.

Figure 1:
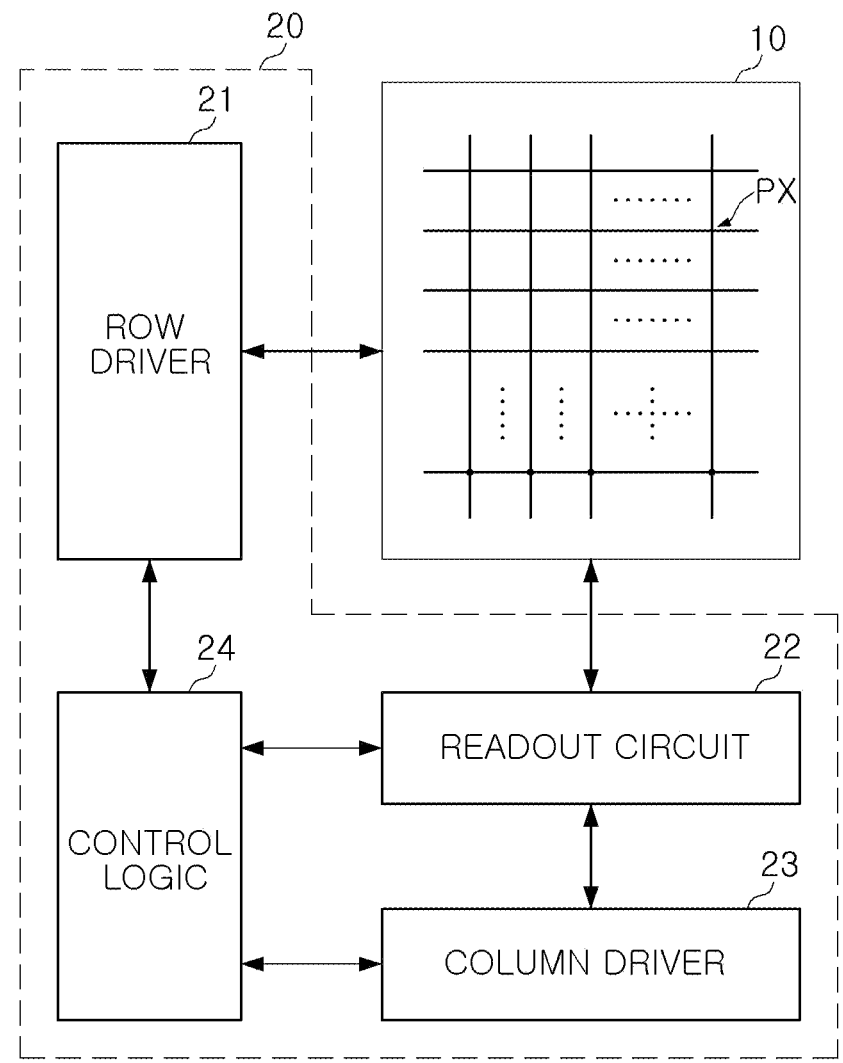
FIG. 1 is a schematic block diagram of an image sensor according to an example embodiment.

FIG. 1 is a schematic block diagram of an image sensor according to an example embodiment.

Referring to FIG. 1, an image sensor 1 may include a pixel array 10, a logic circuit 20, and the like.

The pixel array 10 may include a plurality of pixels PX arranged in an array of a plurality of rows and a plurality of columns. Each of the plurality of pixels PX may include at least one photoelectric conversion element configured to generate a charge in response to light, a pixel circuit configured to generate a pixel signal corresponding to the charge generated by the photoelectric conversion element, and the like. The photoelectric conversion element may include a photodiode, formed of a semiconductor material, and/or an organic photodiode formed of an organic material.

As an example, the pixel circuit may include a floating diffusion region, a transmission transistor, a reset transistor, a driving transistor, and a selection transistor. A configuration of the pixels PX may vary according to example embodiments. As an example, each of the pixels PX may include an organic photodiode including an organic material, or may be implemented as a digital pixel. When the pixels PX are implemented as digital pixels, each of the pixels PX may include an analog-to-digital converter configured to output a digital pixel signal.

The logic circuit 20 may include circuits configured to control the pixel array 10. For example, the logic circuit 20 may include a row driver 21, a readout circuit 22, a column driver 23, a control logic 24, and the like. The row driver 21 may drive the pixel array 10 in units of row lines. For example, the row driver 21 may generate a transmission control signal for controlling the transmission transistor of the pixel circuit, a reset control signal for controlling the reset transistor of the pixel circuit, a selection control signal for controlling the selection transistor of the pixel circuit, and the like, and may input the generated control signals to the pixel array 10 in units of row lines.

The readout circuit 22 may include a correlated double sampler (CDS), an analog-to-digital converter (ADC), and the like. Correlated double samplers may be connected to the pixels PX through column lines. The correlated double samplers may read a pixel signal through column lines from pixels PX connected to a row line selected by a row line select signal of the row driver 21. The analog-to-digital converter may convert a pixel signal, detected by the correlated double sampler, into a digital pixel signal and may transmit the converted digital signal to the column driver 23.

The column driver 23 may include a latch or buffer circuit configured to temporarily store a digital pixel signal, an amplifier circuit, and the like, and may process a digital pixel signal received from the readout circuit 22. The row driver 21, the readout circuit 22, and the column driver 23 may be controlled by the control logic 24. The control logic 24 may include a timing controller controlling operation timings of the row driver 21, the readout circuit 22, and the column driver 23.

Among the pixels PX, pixels PX disposed in the same position in a horizontal direction may share the same column line. As an example, pixels PX disposed in the same position in a vertical direction may be simultaneously selected by the row driver 21 and may output a pixel signal through column lines. In an example embodiment, the readout circuit 22 may simultaneously obtain pixel signals from the pixels PX selected by the row driver 21 through the column lines. The pixel signal may include a reset voltage and a pixel voltage, and the pixel voltage may be a voltage in which charges generated in response to light in each of the pixels PX are reflected in the reset voltage.

Each of the pixels PX may include a color filter having a predetermined color, and may be classified as a red pixel, a green pixel, a blue pixel, or the like, depending on a color of a color filter. The color of the color filter is not limited to red, green, and blue, and the color filter may have a color such as yellow or white according to example embodiments.

Externally entered light may pass through a color filter to be incident on the photodiode of each of the pixels PX. The light passing through the color filter may enter another adjacent pixel, rather than a corresponding pixel, depending on a direction in which light entering each of the pixels PX propagates. For example, light passing through a green color filter of a green pixel may enter a photodiode of an adjacent blue pixel or may enter a photodiode of an adjacent red pixel. When such optical crosstalk occurs, the quality of an image may be degraded.

An effect of optical crosstalk on the quality of an image may be increased in proportion to a distance between a color filter and a photodiode. In an example embodiment, a horizontal insulating layer is disposed between a color filter and a photodiode to cure defects of a semiconductor substrate, on which a photodiode is formed, and the horizontal insulating layer may be formed only of a high-K dielectric material, and to have a thickness of 1000 angstroms or less. Accordingly, the distance between the color filter and the photodiode may be significantly reduced, which may reduce the effect of the optical crosstalk, improve dark level characteristics, and effectively suppress generation of white spots in an image.

Figure 2:
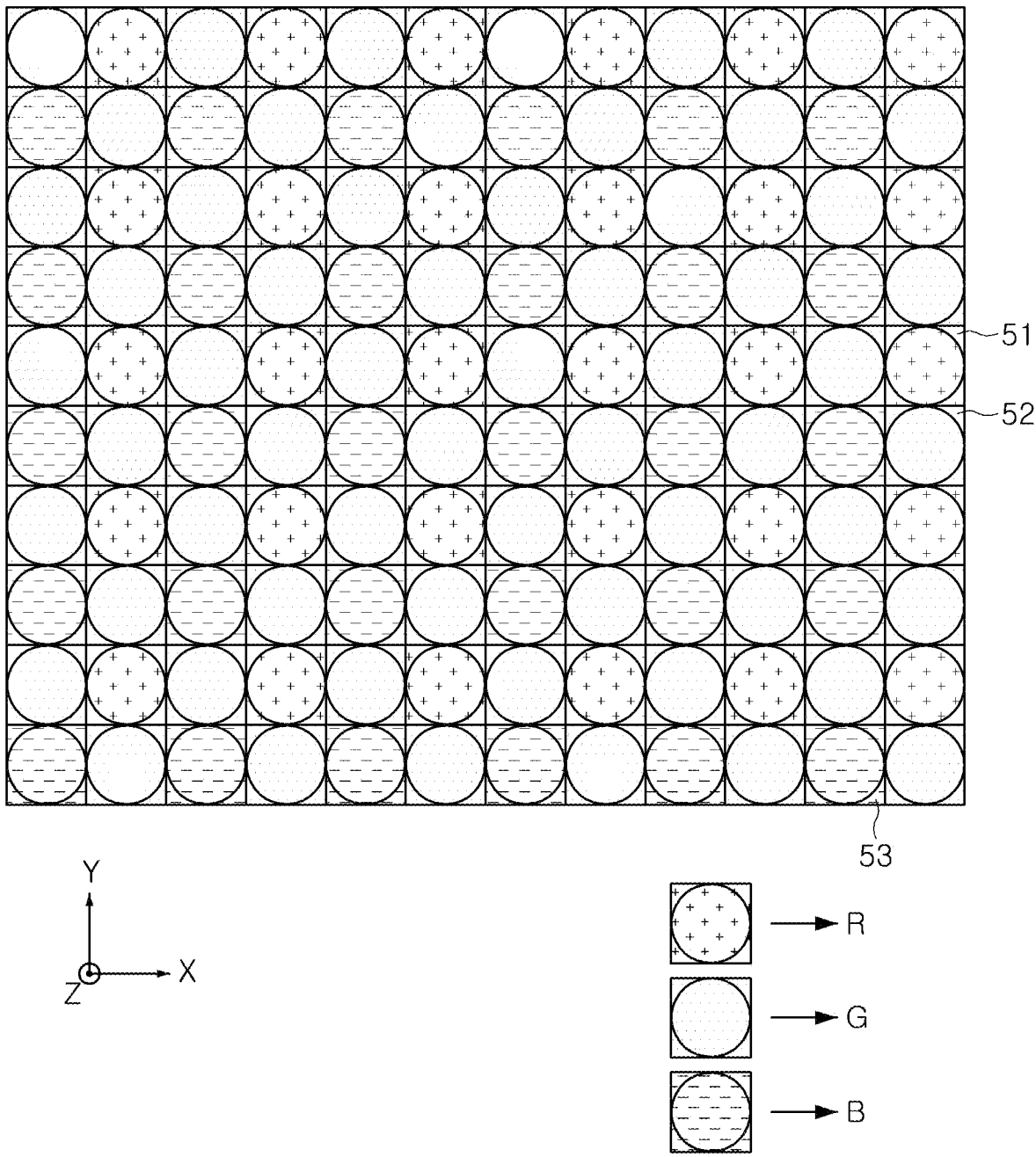
FIG. 2 is a schematic diagram of a pixel array of an image sensor according to an example embodiment.

FIG. 2 is a schematic diagram of a pixel array of an image sensor according to an example embodiment.

Referring to FIG. 2, a pixel array 50 of an image sensor according to an example embodiment may include a plurality of pixels 51, 52 53 arranged in a first direction (an X-axis direction) and a second direction (a Y-axis direction). As an example, the pixel array 50 may include red pixels 51, green pixels 52, and blue pixels 53. Each of the red pixels 51 may include a red color filter, each of the green pixels 52 may include a green color filter, and each of the blue pixels 53 may include a blue color filter. However, according to example embodiments, the pixel array 50 may further include at least one yellow pixel, at least one white pixel, and the like.

In the embodiment illustrated in FIG. 2, each of the green pixels 52 may be adjacent to some of the red pixels 51 and some of the blue pixels 53 in the first direction and the second direction. For example, each of the plurality of pixels 51 to 53 may be adjacent to other pixels 51 to 53 including color filters of other colors in the first direction and the second direction.

Accordingly, when a propagation direction of light incident on each of the plurality of pixels 51 to 53 forms a predetermined angle with respect to a third direction (a Z-axis direction), optical crosstalk may occur. For example, in the case in which a propagation direction of light is not parallel to the third direction and is inclined in the first direction, at least a portion of light passing through the red color filter may enter the green pixels 52 adjacent to the red pixels 51 in the first direction. In contrast, at least a portion of light passing through the green color filter 52 may enter the red pixels 51 adjacent to the green pixels 52 in the first direction. Optical crosstalk may also occur between the green pixels 52 and the blue pixels 53 according to a similar principle.

As an example, the pixel array 50 may include a photodiode array, a color filter array, and a microlens array. The photodiode array includes a plurality of photodiodes formed on the semiconductor substrate in the first direction and the second direction, and the plurality of photodiodes may be separated from each other in the first direction and the second direction by a pixel isolation layer.

The color filter array may include a plurality of color filters disposed on a surface of the semiconductor substrate in the first direction and the second direction, and the plurality of color filters may be separated from each other in the first direction and the second direction by a filter isolation layer. The microlens array may be disposed on the color filter array, so that the color filter array may be disposed between the microlens array and the photodiode array in the third direction. In an example embodiment, each of the plurality of pixels 51 to 53 may include a single color filter, a single microlens, and at least one photodiode.

A horizontal insulating layer may be disposed between the color filter array and the photodiode array in the third direction. Light, passing through the color filter array, may pass through the horizontal insulating layer to be directly incident on a photodiode, or may be incident on a photodiode after being reflected by the filter isolation layer and/or the pixel isolation layer. However, at least a portion of the light, propagating in a direction, not parallel to the third direction, and passing through the color filter, may pass through the horizontal insulating layer between the pixel isolation layer and the filter isolation layer to enter another adjacent pixel.

In an embodiment, to address the above problems, the horizontal insulating layer between the color filter array and the photodiode array may be formed to have a significantly low thickness. As an example, the horizontal insulating layer may include a plurality of layers formed of different materials, and a total thickness thereof may be 1000 angstroms or less. Accordingly, the amount of light, passing through the horizontal insulating layer between the pixel isolation layer and the filter isolation layer, and may cause optical crosstalk, may be significantly reduced, and the performance of the image sensor may be improved.

Figure 3:
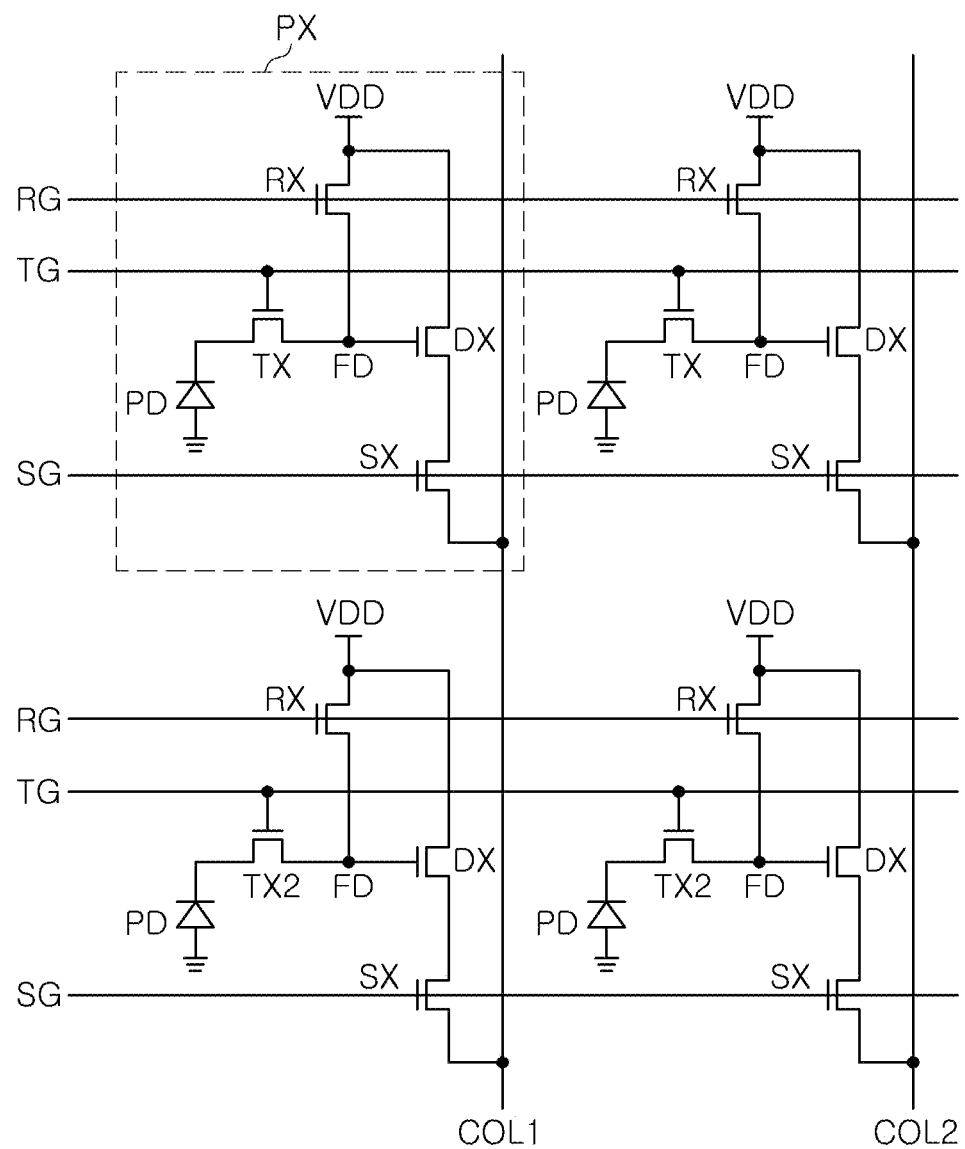
FIGS. 3 and 4 are schematic diagrams of a pixel circuit of an image sensor according to an example embodiment.
Figure 4:
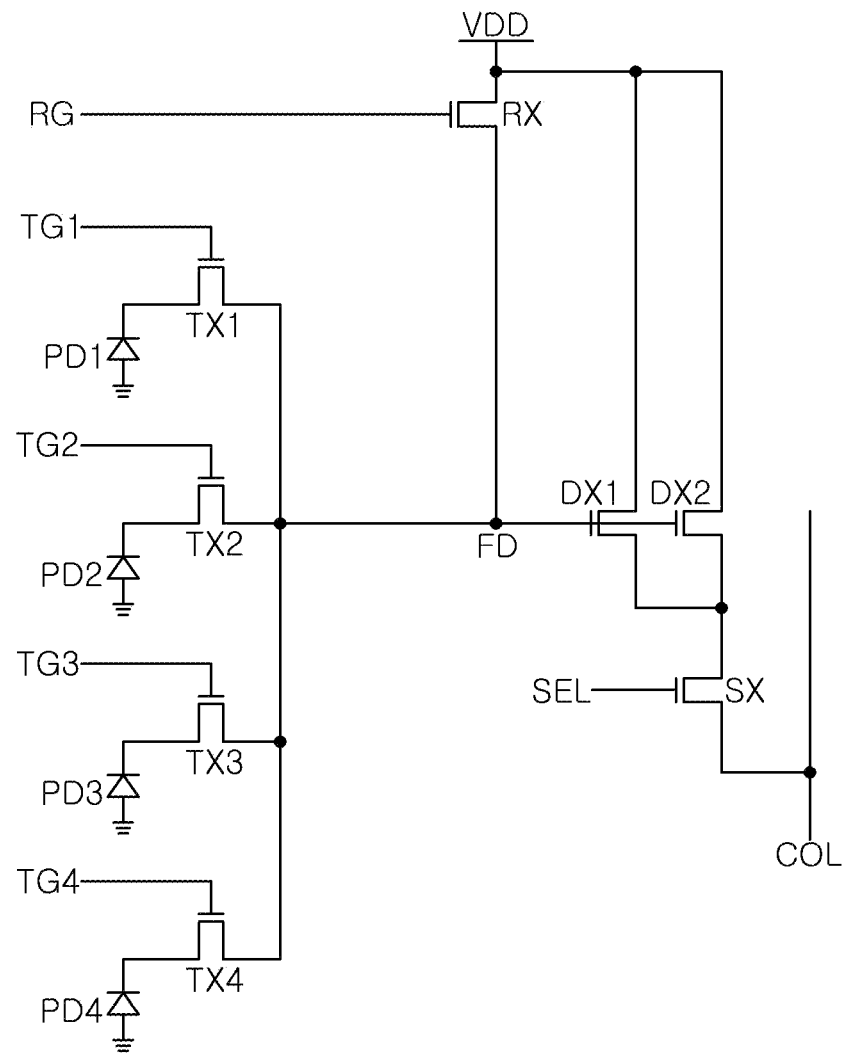

FIGS. 3 and 4 are schematic diagrams of a pixel circuit of an image sensor according to an example embodiment.

Referring to FIG. 3, each of a plurality of pixels PX may include a photodiode PD and a pixel circuit. The pixel circuit may include a transmission transistor TX, a reset transistor RX, a selection transistor SX, a driving transistor DX, and the like, and the pixel circuit may include a floating diffusion region FD in which charges generated by the photodiode PD are accumulated.

The photodiode PD may generate charges in response to externally incident light and may accumulate the generated charges. The photodiode PD may be replaced with a phototransistor, a photogate, a pinned photodiode, or the like, according to example embodiments. The transmission transistor TX may move the charges, generated by the photodiode PD, to the floating diffusion region FD. The floating diffusion region FD may store the charges generated by the photodiode PD. A voltage output from the driving transistor DX may vary depending on the amount of the charges accumulated in the floating diffusion region FD.

The reset transistor RX may remove the charges, accumulated in the floating diffusion region FD, to reset a voltage of the floating diffusion region FD. A drain electrode of the reset transistor RX may be connected to the floating diffusion region FD, and a source electrode of the reset transistor RX may be connected to a power supply voltage VDD. When the reset transistor RX is turned on, the power voltage VDD connected to the source electrode of the reset transistor RX may be applied to the floating diffusion region FD and the reset transistor RX may remove the charges accumulated in the floating diffusion region FD.

The driving transistor DX may operate as a source follower buffer amplifier. The driving transistor DX may amplify a change in the voltage of the floating diffusion region FD, and may output the amplified change to one of column lines COL1 and COL2. The selection transistor SX may select the pixels PX to be read in units of rows. When the selection transistor SX is turned on, a voltage of the driving transistor DX may be output to one of the column lines COL1 and COL2. As an example, when the selection transistor SX is turned on, a reset voltage or a pixel voltage may be output through the column lines COL1 and COL2.

In the embodiment illustrated in FIG. 3, each of the plurality of pixels PX may include not only the photodiode PD and the transmission transistor TX, but also the reset transistor RX, the selection transistor SX, and the driving transistor DX. However, with the trend for an increase in the number of pixels PX included in a single image sensor and a decrease in area of each of the pixels PX resulting from a limitation in form factor of a device on which an image sensor is mounted, or the like, it may be difficult for each of the pixels PX to include all components of a pixel circuit. In this case, two or more pixels PX adjacent to each other in the pixel array of the image sensor may share at least some of the components included in the pixel circuit. Hereinafter, this will be described in more detail with reference to FIG. 4.

Referring to FIG. 4, two or more pixels adjacent to each other may share at least some of transistors included in a pixel circuit. In the embodiment illustrated in FIG. 4, four pixels adjacent to each other may share a single floating diffusion region FD and a single reset transistor RX, driving transistors DX1 and DX2, and a selection transistor SX.

As an example, a first photodiode PD1 of a first pixel and a first transmission transistor TX1 may be connected to the floating diffusion region FD. Similarly, second to fourth photodiodes PD2 to PD4 of second to fourth pixels PX2 to PX4 may be connected to the floating diffusion region FD through second to fourth transmission transistors TX2 to TX4, respectively. As an example, the first to fourth transmission transistors TX1 to TX4 may be commonly connected to the single floating diffusion region FD by connecting the floating diffusion regions FD, respectively included in the pixels, to each other through an interconnection pattern, or the like.

The pixel circuit may include the reset transistor RX, the first and second driving transistors DX1 and DX2, and the selection transistor SX. The reset transistor RX may be controlled by a reset control signal RG, and the selection transistor SX may be controlled by a selection control signal SEL. As an example, each of the four pixels may further include a single transistor, other than the transmission transistor TX. Among the four transistors included in the four pixels, two transistors may be connected in parallel to provide the first and second driving transistors DX1 and DX2, and one of the remaining two transistors may be provided as the selection transistor SX and the other one may be configured to provide the reset transistor RX.

However, the pixel circuit described with reference to FIG. 4 is only an example and an example embodiment is not limited thereto. As an example, one of the four transistors may be assigned to a driving transistor, and one of the four transistors may be assigned to a selection transistor. In addition, the remaining two transistors may be connected to each other in series and respectively assigned to the first and second reset transistors to implement an image sensor which may adjust a conversion gain of a pixel. Alternatively, the pixel circuit may vary depending on the number of transistors included in each of the pixels.

Figure 5:
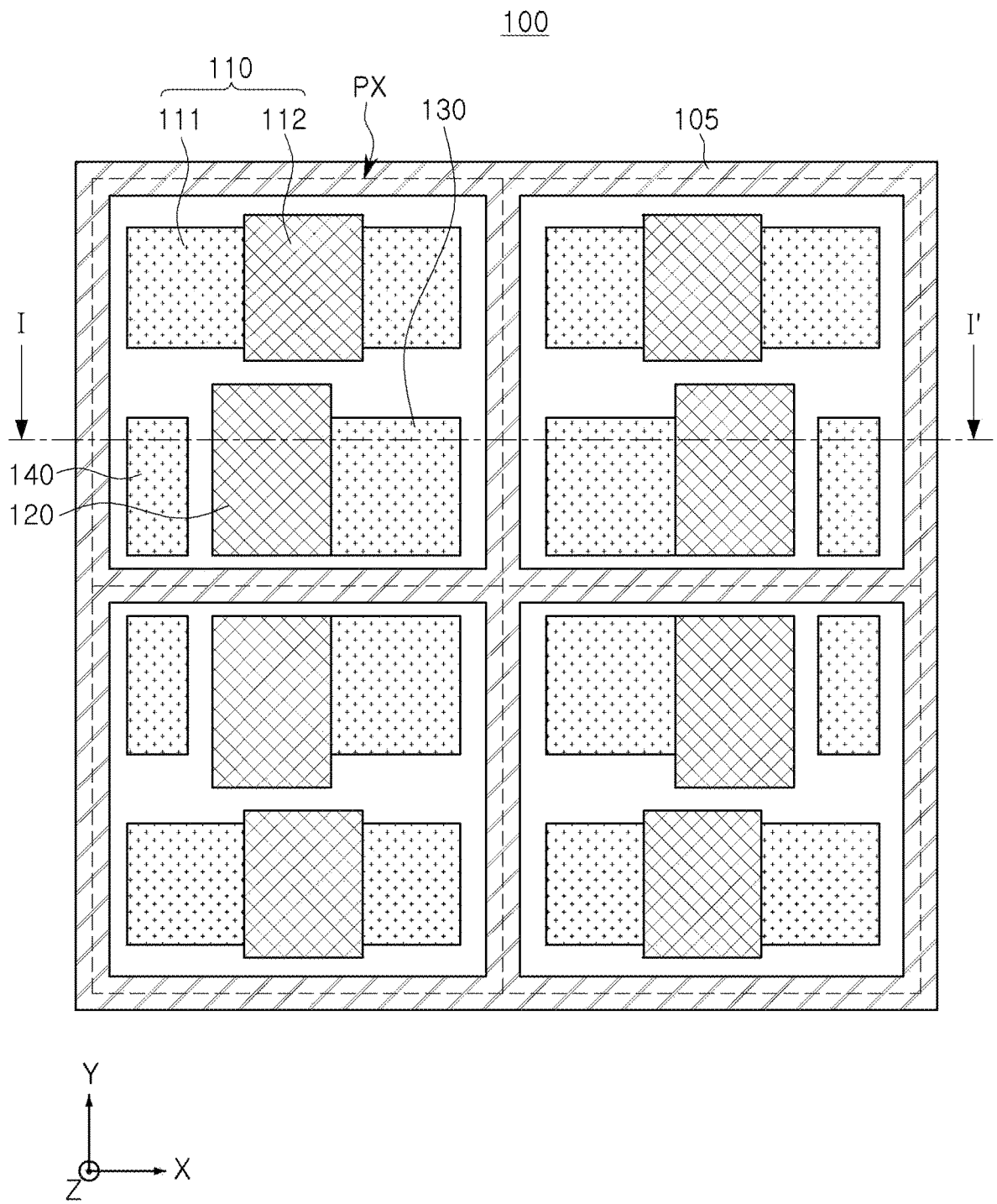
FIGS. 5 and 6 are diagrams illustrating a pixel array of an image sensor according to an example embodiment.
Figure 6:
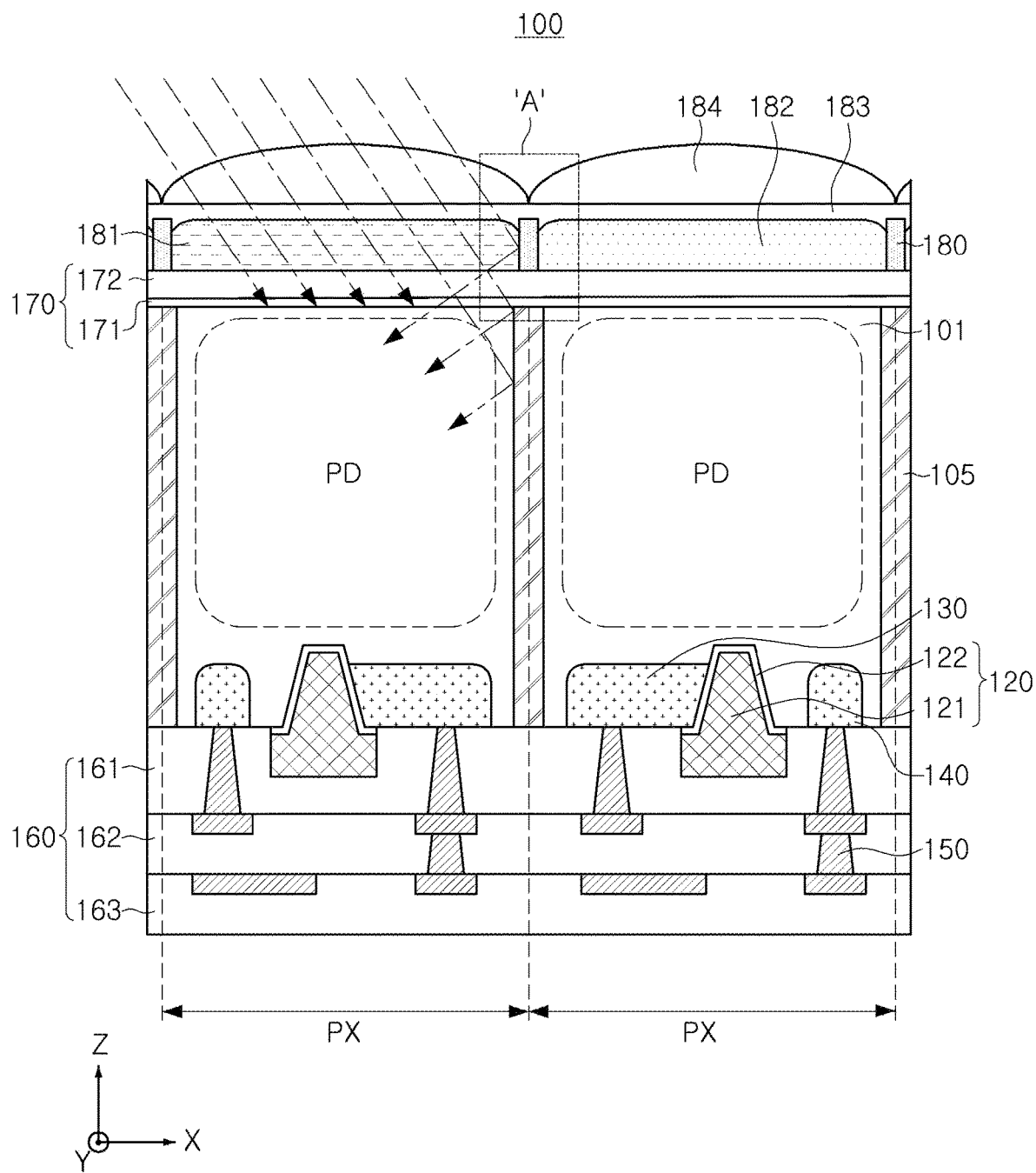

FIGS. 5 and 6 are diagrams illustrating a pixel array of an image sensor according to an example embodiment.

As an example, FIGS. 5 and 6 may be schematic diagrams illustrating at least a region of a pixel array included in an image sensor 100, and FIG. 6 may be a cross-sectional view illustrating a cross-section in a direction I-I' of FIG. 5. Referring to FIGS. 5 and 6, a plurality of pixels PX may be disposed in a plurality of pixel regions arranged in a first direction (an X-axis direction) and a second direction (a Y-axis direction), parallel to an upper surface of a substrate 101. The plurality of pixel regions may be defined by a pixel isolation layer 105. Accordingly, the pixel isolation layer 105 may be disposed between the plurality of pixels PX.

Referring to FIG. 5, each of the plurality of pixels PX may include a pixel circuit region disposed within the pixel isolation layer 105. As an example, the pixel circuit region may include at least one transistor 110, a transmission gate structure 120, a floating diffusion region 130, an impurity region 140, and the like.

The floating diffusion region 130, as a region doped with first conductivity-type impurities, may be a region in which charges generated by a photodiode are accumulated. The floating diffusion region 130 may be adjacent to the transmission gate structure 120. The transmission gate structure 120 may be adjacent to a photodiode formed in the pixel isolation layer 105 in a third direction (a Z-axis direction). As an example, the first conductivity-type impurities may be N-type impurities. A shape of the floating diffusion region 130 is not limited to that illustrated in FIG. 5 and may vary according to example embodiments.

When a first bias voltage is input to the transmission gate structure 120, charges generated by a photodiode may not move to the floating diffusion region 130. When a voltage of the transmission gate structure 120 is increased to a second bias voltage higher than the first bias voltage, the charges generated by the photodiode may move to the floating diffusion region 130. As an example, the first bias voltage may be a negative voltage, and the second bias voltage may be a positive voltage. An absolute value of the first bias voltage may be smaller than an absolute value of the second bias voltage.

The transistor 110 may provide at least one of a reset transistor, a selection transistor, and a driving transistor included in a pixel circuit. As described above with reference to FIG. 4, two or more pixels PX adjacent to each other may share the transistor 110 to implement a pixel circuit. Referring to FIG. 5, the transistor 110 may include a gate structure 112 and source/drain regions 111 on opposite sides adjacent to the gate structure 112. In an example embodiment, an area of each of the source/drain regions 111 may be smaller than that of the floating diffusion region 130. This may be because the floating diffusion region 130, in which the charges generated by the photodiode are accumulated, needs to secure a relatively large area.

Each of the plurality of pixels PX may include the floating diffusion region 130 and the at least one impurity region 140 separated from the transistor 110. As an example, as illustrated in FIG. 5, the floating diffusion region 130 may be disposed on one side of the transmission gate structure 120, and the impurity region 140 may be disposed on the other side of the transmission gate structure 120. However, the impurity region 140 may not be in direct contact with the transmission gate structure 120 and may be separated from the transmission gate structure 120 by a device isolation layer. In an example embodiment, the impurity region 140 may be doped with second conductivity-type impurities, different from those of the floating diffusion region 130 and the source/drain regions 111 of the transistor 110. A ground voltage may be input to the impurity region 140.

Referring to FIG. 6, the substrate 101 may include a first surface and a second surface facing each other in the third direction. As an example, an optical unit may be disposed on the first surface, and interconnection patterns 150 and an interlayer insulating layer 160 may be disposed on the second surface. The interconnection patterns 150 may connect the transistor 110, the transmission gate structure 120, the floating diffusion region 130, and the impurity region 140 to each other to provide a pixel circuit. The interlayer insulating layer 160 may include a plurality of interlayer insulating layers 161, 162,o 163, and may cover the transistor 110, the transmission gate structure 120, the floating diffusion region 130, the impurity region 140, and the interconnection patterns 150. As an example, the interlayer insulating layer 160 may be formed of silicon oxide, silicon nitride, or the like.

The optical unit disposed on the first surface of the substrate 101 may include a horizontal insulating layer 170, a filter isolation layer 180, color filters 181 and 182, a planarization layer 183, and microlenses 184. In an example embodiment, the filter isolation layer 180 may be in the form of a checkerboard extending in the first direction and the second direction, similarly to the pixel isolation layer 105, and the color filters 181 and 182 adjacent to each other in the first direction and the second direction may be separated from each other by the filter isolation layer 180. The filter isolation layer 180 and the color filters 181 and 182 may provide a color filter array, and the microlenses 184 may provide a microlens array.

Light, passing through the optical unit, may be incident on the photodiode PD included in each of the plurality of pixels PX. In the example embodiment illustrated in FIGS. 5 and 6, each of the plurality of pixels PX is illustrated as including a single photodiode PD. However, according to embodiments, two or more photodiodes PD may be included in at least one of the plurality of pixels PX. As an example, two or more photodiodes PD adjacent to each other in the first direction or the second direction may be disposed in a single pixel PX to implement an autofocusing function.

Light, entering the image sensor 100, may be refracted by the microlenses 184. The refracted light may enter the color filters 181 and 182 after passing through the planarization layer 183. Light in a predetermined wavelength band may be filtered by the color filters 181 and 182. The filtered light may enter the photodiode PD of each of the plurality of pixels PX after passing through the horizontal insulating layer 170.

In this case, when the light incident on each of the plurality of pixels PX is not parallel to the third direction, at least a portion of the light may not be directly incident on the photodiode PD due to the incident angle of the light, as illustrated in FIG. 6. As an example, at least a portion of light may be reflected by the filter isolation layer 180 and/or the pixel isolation layer 105 to be incident on the photodiode PD. However, since the horizontal insulating layer 170 is disposed between the filter isolation layer 180 and the pixel isolation layer 105, a portion of the light may be not reflected by the filter isolation layer 180 and the pixel isolation layer 105 but may pass through the horizontal insulating layer 170 to be incident to another adjacent pixel PX. For example, light passing through the first color filter 181 may be incident on not a photodiode PD disposed below the first color filter 181, but a photodiode PD disposed below the adjacent second color filter 182.

In an example embodiment, a thickness of the horizontal insulating layer 170 may be significantly reduced to address the above issue. The horizontal insulating layer 170 may be formed to cure defects of the substrate 101 occurring during a manufacturing process of the image sensor 100. As an example, excess charges may be generated due to defects occurring in the substrate 10 during the manufacturing process of the image sensor 100, so that dark level characteristics of the image sensor 100 may be degraded or a white spot may be generated in an image output by the image sensor 100.

The horizontal insulating layer 170 may be formed of a high-K dielectric material for curing the defects that cause the excess charges. As an example, the high-K dielectric material included in the horizontal insulating layer 170 may be a material having a dielectric constant higher than that of silicon oxide ($SiO_x$). For example, but not limited to, the high-K dielectric material may include at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

In an example embodiment, the horizontal insulating layer 170 may be formed of only a high-K dielectric material, not including silicon (that is, silicon-free material). For example, in the example embodiment illustrated in FIG. 6, both the first insulating layer 171 and the second insulating layer 172 included in the horizontal insulating layer 170 may be formed of a high-K material. The first insulating layer 171 and the second insulating layer 172 may include the same material or different materials. As an example, the first insulating layer 171 may be formed of aluminum oxide and the second insulating layer 172 may be formed of hafnium oxide, but example embodiments are not limited thereto.

A thickness of the first insulating layer 171 may be smaller than that of the second insulating layer 172. In addition, a total thickness of the horizontal insulating layer 170 may be limited to a predetermined reference value or less to significantly reduce entry of the light passing through the color filters 181 and 182 of another adjacent pixel PX. As an example, in an example embodiment, the horizontal insulating layer 170 may be formed to have a thickness of 1000 angstroms or less.

Figure 7:
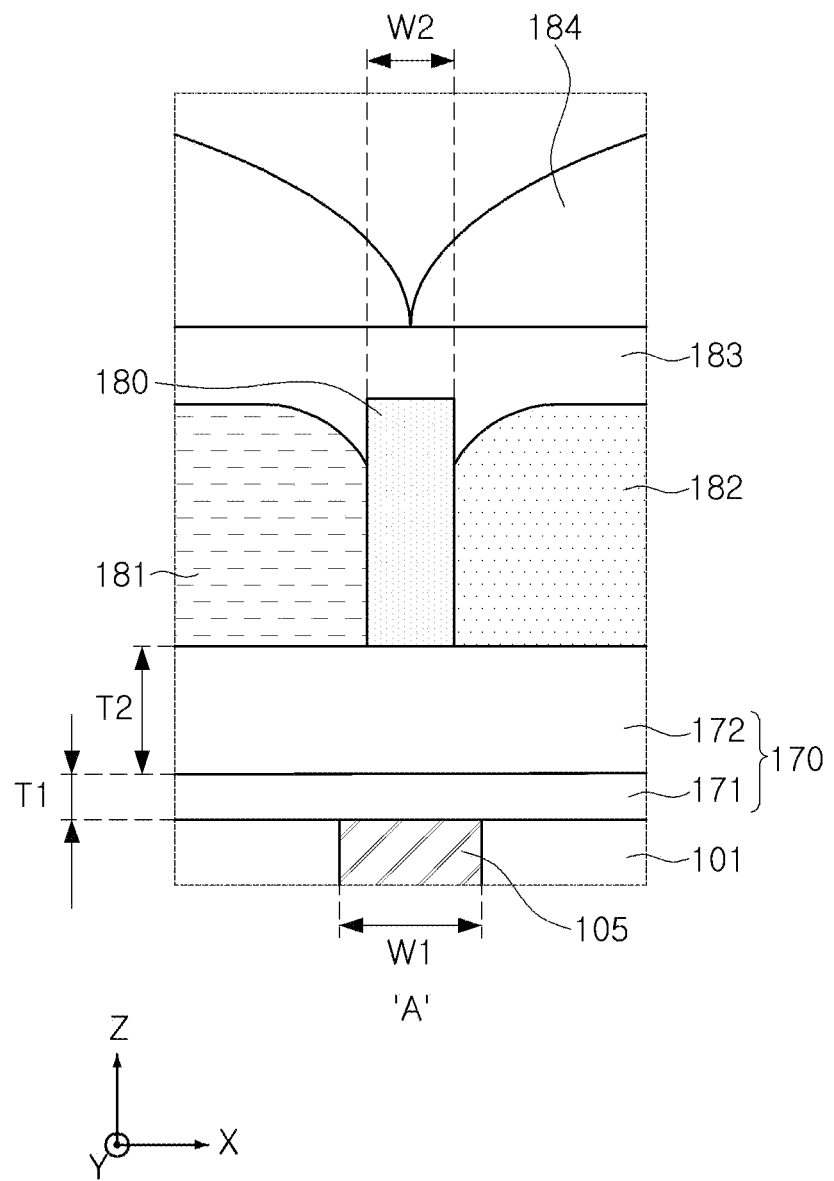
FIG. 7 is an enlarged view of region "A" of FIG. 6.

FIG. 7 is an enlarged view of region "A" of FIG. 6.

Referring to FIG. 7, the filter isolation layer 180 and the pixel isolation layer 105 may be disposed on a boundary between pixels, and the horizontal insulating layer 170 may be disposed between the filter isolation layer 180 and the pixel isolation layer 105. The pixel isolation layer 105 and the substrate 101 may be disposed below the horizontal insulating layer 170, and the filter isolation layer 180 and the color filters 181 and 182 may be disposed on the horizontal insulating layer 170. The planarization layer 183 and the microlenses 184 may be disposed on the color filters 181 and 182. In an example embodiment, the planarization layer 183 may include an organic material layer, or may be formed of silicon oxide, silicon nitride, silicon oxynitride, or the like.

The filter isolation layer 180 may be formed of a material for separating the color filters 181 and 182 from each other and reflecting light incident obliquely so as not to be parallel to a third direction (a Z-axis direction). As an example, the filter isolation layer 180 may be formed of a polymer material including silica nanoparticles. According to example embodiments, a protective layer may be provided on the filter isolation layer 180 and may be formed of aluminum oxide, or the like. In addition, according to example embodiments, the filter isolation layer 180 may have a structure in which two or more layers are stacked.

Referring to FIG. 7, the pixel isolation layer 105 may have a first width W1 and the filter isolation layer 180 may have a second width W2. The first width W1 may be greater than the second width W2. However, this is only an example and example embodiments are not limited thereto. In some embodiments, the first width W1 and the second width W2 may have substantially the same value. In addition, a width of at least one of the pixel isolation layer 105 and the filter isolation layer 180 may be increased or decreased in the third direction. Accordingly, at least one of the pixel isolation layer 105 and the filter isolation layer 180 may have an inclined side surface.

Referring to FIG. 7, the horizontal insulating layer 170 may include a first insulating layer 171 and a second insulating layer 172. The first insulating layer 171 may have a first thickness T1, and the second insulating layer 172 may have a second thickness T2 higher than the first thickness T1. A sum of the first thickness T1 and the second thickness T2 may be 1000 angstroms or less. The horizontal insulating layer 170 may be formed to have a thickness of 1000 angstroms or less, so as to avoid a case in which light passing through one of the color filters 181 and 182 at an incident angle, not parallel to the third direction, is incident on a photodiode PD below the other one of the filters 181 and 182.

In an example embodiment, the first thickness T1 of the first insulating layer 171 may be 50 angstroms more to 150 angstroms or less, and the second thickness T2 of the second insulating layer 172 may be several hundreds of angstroms. As an example, the second thickness T2 may be twice or more the first thickness T1. The first insulating layer 171 may be formed of a high-K dielectric material, not including silicon (that is, silicon-free material), and thus may be in direct contact with the substrate 101 to cure defects present in the substrate 101. The second insulating layer 172 may also be formed of a high-K dielectric material, not including silicon (that is, silicon-free material).

Figure 8:
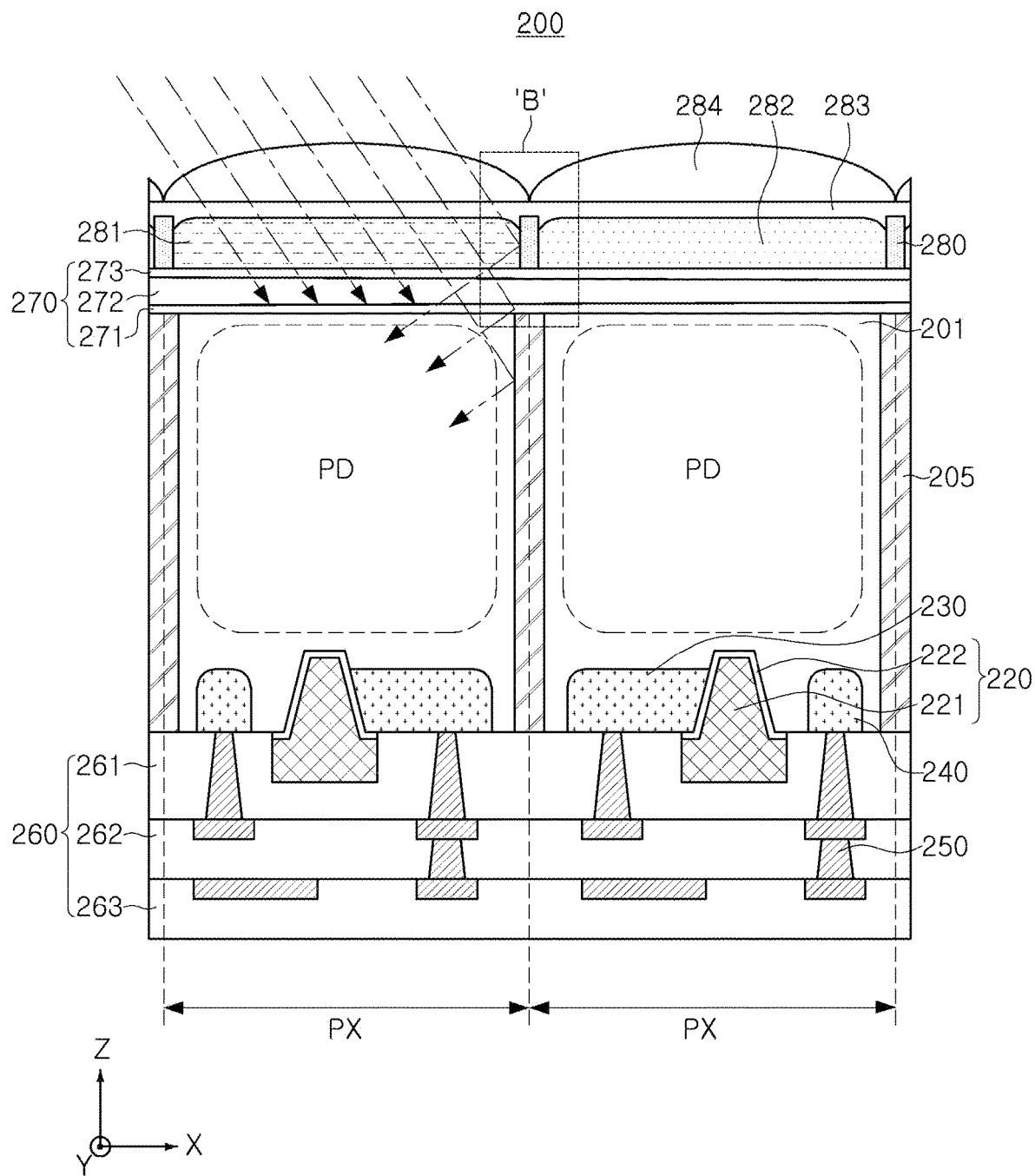
FIG. 8 is a diagram illustrating a pixel array of an image sensor according to an example embodiment.

FIG. 8 is a diagram illustrating a pixel array of an image sensor according to an example embodiment.

FIG. 8 may be a schematic diagram illustrating at least a region of a pixel array included in an image sensor 200 according to an example embodiment. Referring to FIG. 8, a plurality of pixels PX may be disposed in a first direction (an X-axis direction) and a second direction (a Y-axis direction), parallel to an upper surface of a substrate 201, and may be separated from each other by a pixel isolation layer 105.

A photodiode PD may be formed in the substrate 201. As an example, each of the plurality of pixels PX may include at least one photodiode PD. The substrate 201 may have a first surface and a second surface, parallel to each other in a third direction (a Z-axis direction). An optical unit may be disposed on the first surface, and a pixel circuit region may be disposed on the second surface. The pixel circuit region may include a transmission gate structure 220, a floating diffusion region 230, an impurity region 240, interconnection patterns 250, and an interlayer insulating layer 260. The interlayer insulating layer 260 may include a plurality of interlayer insulating layers 261, 262, 263, and the pixel circuit region may further include at least one transistor. Configurations of the transmission gate structure 220, the floating diffusion region 230, the impurity region 240, the interconnection patterns 250, and the interlayer insulating layer 260 may be similar to those described above with reference to FIG. 6, and a repetitive description is thus omitted.

The optical unit disposed on the first surface of the substrate 201 may include a horizontal insulating layer 270, a filter isolation layer 280, color filters 281 and 282, a planarization layer 283, and microlenses 284. In an example embodiment, the filter isolation layer 280 may be disposed on a boundary between the plurality of pixels PX, and may separate the color filters 281 and 282 from each other. Similarly, the pixel isolation layer 205 may be disposed on a boundary between the plurality of pixels PX. As an example, the filter isolation layer 280 and the color filters 281 and 282 may provide a color filter array, and the microlenses 284 may provide a microlens array.

As described above, light entering the image sensor 200 may be refracted by the microlenses 284, and may then pass through the planarization layer 283 to enter the color filters 281 and 282. Light in a predetermined wavelength band may be filtered by each of the color filters 281 and 282. The filtered light may pass through the horizontal insulating layer 270 to enter a photodiode PD of each of the plurality of pixels PX.

When the light incident on each of the plurality of pixels PX is not parallel to the third direction, at least a portion of the light may be reflected from the filter isolation layer 280 and/or the pixel isolation layer 205 due to an incident angle of the light, and may then be incident on a photodiode PD. Since the horizontal insulating layer 270 is disposed between the filter isolation layer 280 and the pixel isolation layer 205, at least a portion of the light passing through the horizontal insulating layer 270 may not be reflected by the filter isolation layer 280 and the pixel isolation layer 205.

For example, light passing through the first color filter 281 may be incident on a photodiode PD disposed below the adjacent second color filter 282, rather than a photodiode PD disposed below the first color filter 281. When the first color filter 281 is a blue color filter and the second color filter 282 is a green color filter, blue light may be mixed with green light and the mixed color may be incident on the photodiode PD below the second color filter 282.

In an example embodiment, the above-described issue may be addressed by using a thickness, a material, and/or a structure of the horizontal insulating layer 270. The horizontal insulating layer 270 may be formed to cure defects of the substrate 201 to improve dark level characteristics of the image sensor 200 and to suppress generation of a white spot in the image. In an example embodiment, the horizontal insulating layer 270 may be formed of only a high-K dielectric material for curing, and silicon-containing materials such as silicon oxide or silicon nitride may be excluded from the horizontal insulating layer 270 to significantly reduce the thickness of the horizontal insulating layer 270. As described above, the high-K dielectric material may be a material having a dielectric constant higher than that of silicon oxide ($SiO_x$).

In the example embodiment illustrated in FIG. 8, the horizontal insulating layer 270 may include first to third insulating layers 271, 272, 273. Each of the first to third insulating layers 271 to 273 may be formed of a high-K dielectric material. As an example, the first and third insulating layers 271 and 273 may be formed of a first high-K dielectric material, and the second insulating layer 272 may be formed of a second high-K dielectric material different from the first high-K dielectric material. In an example embodiment, the first and third insulating layers 271 and 273 may be formed of aluminum oxide, and the second insulating layer 272 may be formed of hafnium oxide. However, the material of each of the first to third insulating layers 271-273 is not limited thereto.

In each of the plurality of pixels PX, the horizontal insulating layer 270 may be formed to have a thickness of 1000 angstroms or less to significantly reduce entering of light passing through color filters 181 and 182 of an adjacent pixel PX. In addition, the horizontal insulating layer 270 may effectively cure defects present in the substrate 201 and may prevent additional defects from occurring in the substrate 201 in a process of forming a color filter array, a microlens array, or the like, and may have a thickness of 300 angstroms or more.

A thickness of each of the first insulating layer 271 and the third insulating layer 273 may be less than that of the second insulating layer 272. A sum of the thicknesses of the first insulating layer 271 and the third insulating layer 273 may be less than or equal to the thickness of the second insulating layer 272. In an example embodiment, the first insulating layer 271 and the third insulating layer 273 may have substantially the same thickness.

Figure 9A:
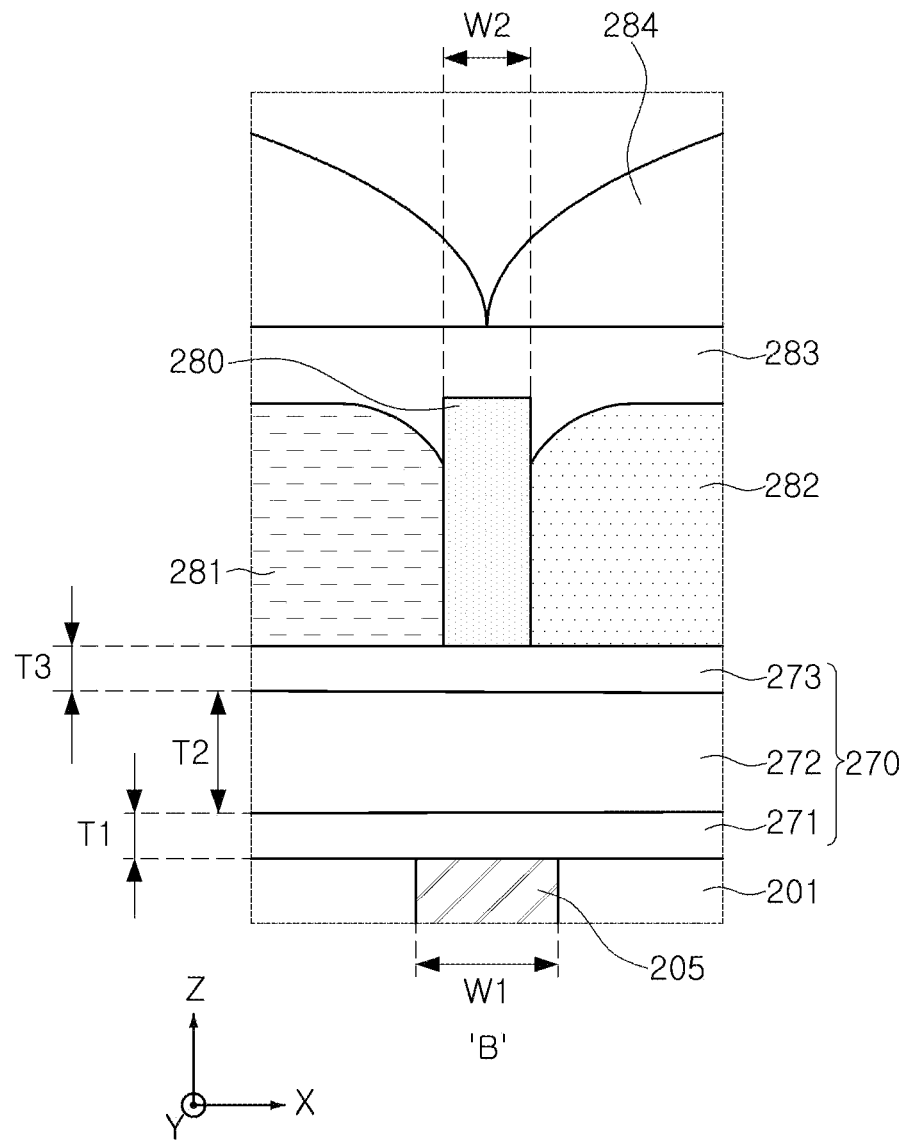
FIGS. 9A to 9C are examples of enlarged views of region "B" of FIG. 8.
Figure 9B:
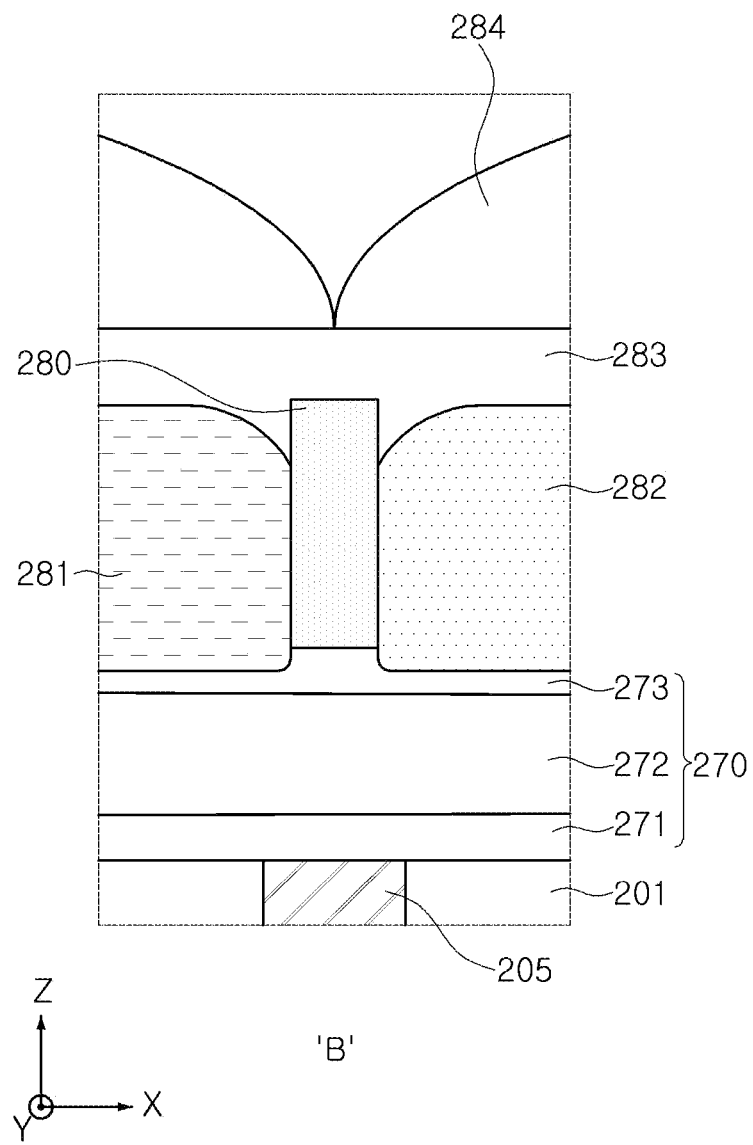
Figure 9C:
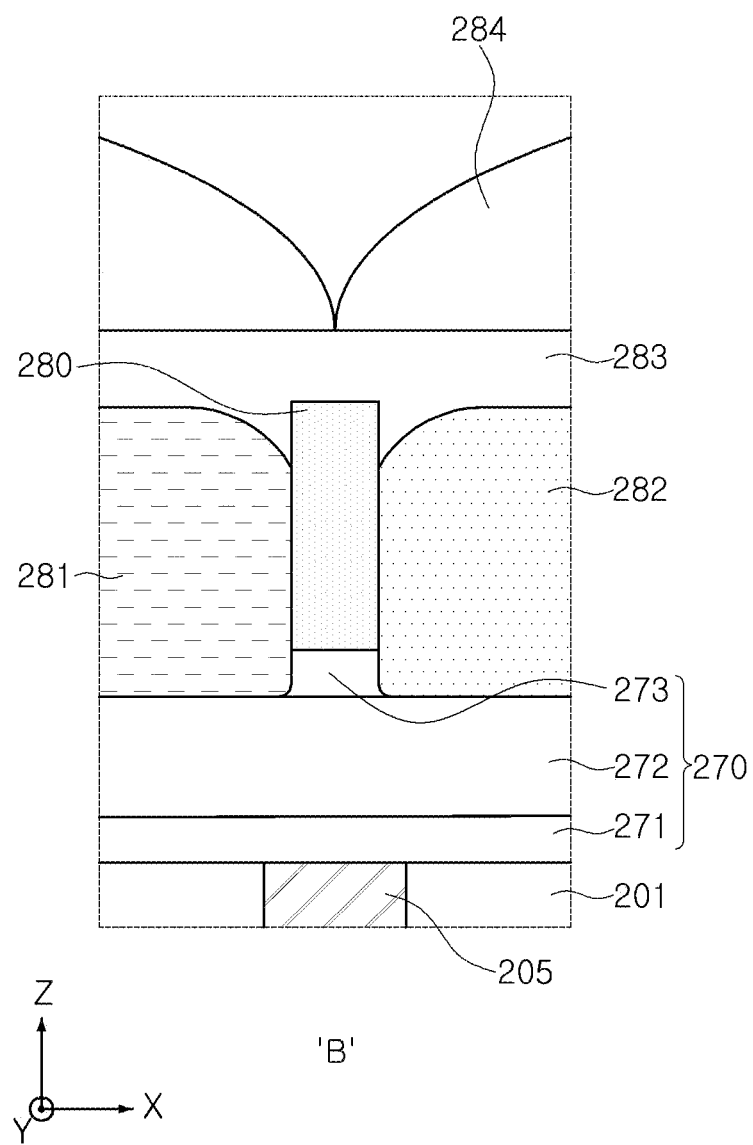

FIGS. 9A to 9C are examples of enlarged views of region "B" of FIG. 8.

Referring to FIG. 9A, the filter isolation layer 280 and the pixel isolation layer 205 may be arranged on a boundary between pixels, and the horizontal insulating layer 270 may be disposed between the filter isolation layer 280 and the pixel isolation layer 205. The horizontal insulating layer 270 may be in contact with the pixel isolation layer 205 and the substrate 201 therebelow, and may be in contact with the filter isolation layer 280 and the color filters 281 and 282 thereabove. The planarization layer 283 and the microlenses 284 may be disposed on the color filters 281 and 282. In an example embodiment, the planarization layer 283 may include an organic material layer, or may be formed of silicon oxide, silicon nitride, silicon oxynitride, or the like.

Referring to FIG. 9A, the pixel isolation layer 105 may have a first width W1 and the filter isolation layer 180 may have a second width W2. The first width W1 may be greater than the second width W2. However, this is only an example, and example embodiments are not limited thereto.

As described above with reference to FIG. 8, the horizontal insulating layer 270 may include first to third insulating layers 271 to 273 sequentially stacked. The first insulating layer 271 may have a first thickness T1, the second insulating layer 272 may have a second thickness T2 greater than the first thickness T1, and the third insulating layer 273 may have a third thickness T3 smaller than the second thickness T2. In some embodiments, the first thickness T1 and the third thickness T3 may be the same, or the third thickness T3 may be greater than the first thickness T1.

A total thickness of the horizontal insulating layer 270 may be 1000 angstroms or less. The horizontal insulating layer 270 may be formed to have a thickness of 1000 angstroms or less, so as to avoid a case in which light passing through one of the color filters 281 and 282 at an incident angle, not parallel to the third direction, is incident on a photodiode PD below the other of the filters 281 and 282.

In an example embodiment, a first thickness T1 of the first insulating layer 271 may be, for example but not limited to, 50 angstroms or more to 150 angstroms or less, and the second thickness T2 of the second insulating layer 272 may be several hundreds of angstroms. As an example, the second thickness T2 may be twice or more the first thickness T1. The third thickness T3 of the third insulating layer 273 may be, for example but not limited to, 50 angstroms or more to 150 angstroms or less.

As described above, each of the first and third insulating layers 271 and 273 may be formed of a first high-K dielectric material, and the second insulating layer 272 may be formed of a second high-K dielectric material. Accordingly, in the horizontal insulating layer 270, an overall thickness of a layer including the first high-K dielectric material may be smaller than an overall thickness of a layer including the second high-K dielectric material. The second high-K dielectric material may be disposed between the first high-K dielectric materials in the third direction.

Referring to FIG. 9B, the third insulating layer 273 may have a non-uniform thickness. As an example, a thickness of the third insulating layer 273 between the pixel isolation layer 205 and the filter isolation layer 280 may be greater than or equal to a thickness of the third insulating layer 273 between the color filters 281 and 282 and the substrate 201. This may be because at least a region of the third insulating layer 273 is removed in an etching process, among processes of forming the filter isolation layer 280.

According to example embodiments, the third insulating layer 273 may be completely removed in an etching process of forming the filter isolation layer 280. In this case, as shown in FIG. 9C, the third insulating layer 273 may be present only below the filter isolation layer 280 and may not be present below the color filters 281 and 282. At least a portion of the second insulating layer 272 may be removed together with the third insulating layer 273. Accordingly, a thickness of the second insulating layer 272 between the pixel isolation layer 205 and the filter isolation layer 280 may be greater than or equal to a thickness of the second insulating layer 272 between the color filters 281 and 282 and the substrate 201.

FIGS. 10 to 19 are diagrams illustrating a method of manufacturing an image sensor according to an example embodiment (illustrating that after deep trench isolation (DTI), it is not a front-side DTI (FDTI) according to the degree of chemical mechanical polishing (CMP)).

Figure 10:
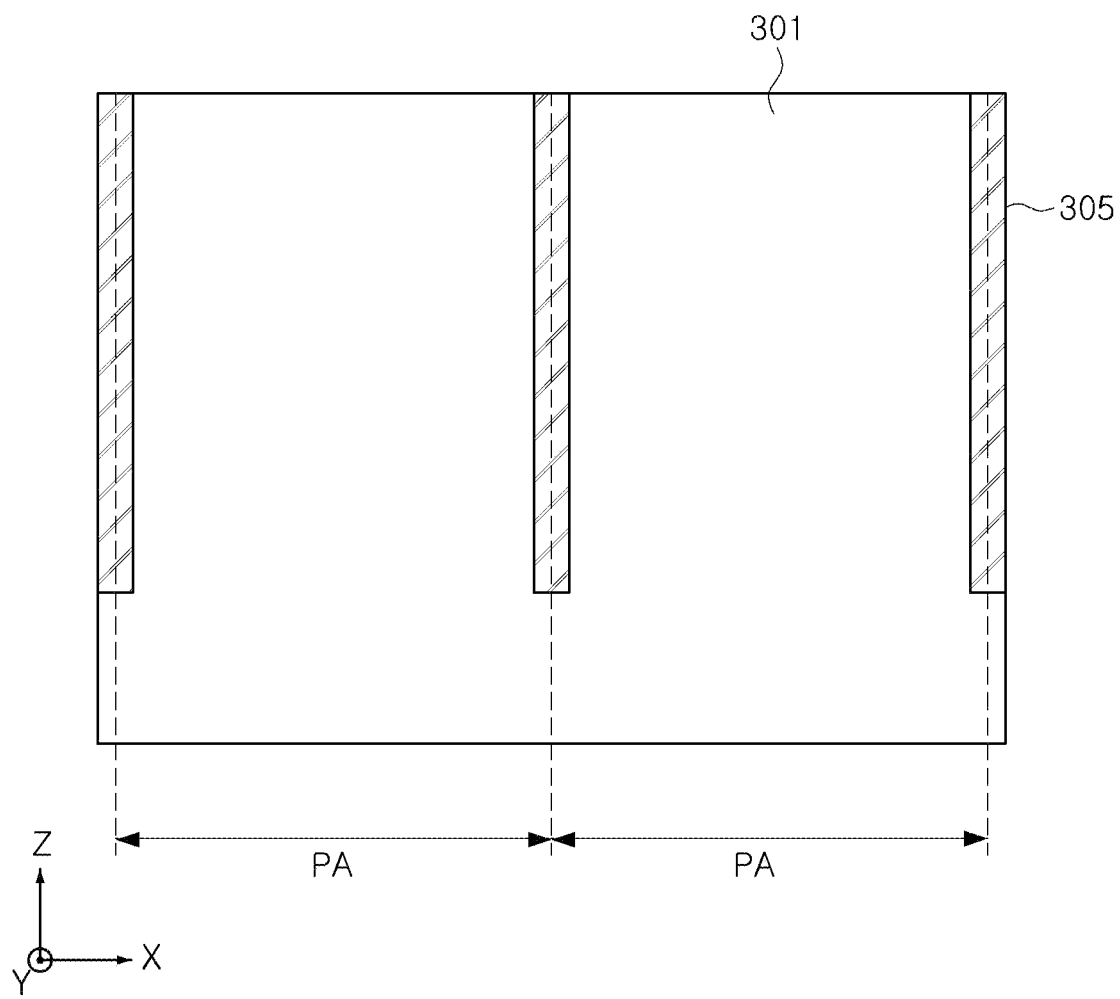
FIGS. 10 to 19 are diagrams illustrating a method of manufacturing an image sensor according to an example embodiment.

Referring first to FIG. 10, the method of manufacturing an image sensor according to an example embodiment may start with an operation of forming a pixel isolation layer 305 on a substrate 301 to define a plurality of pixel regions PA in which a plurality of pixels are to be formed. As described above, the pixel isolation layer 305 may extend in a first direction (an X-axis direction) and a second direction (a Y-axis direction). The pixel isolation layer 305 may be formed by forming trenches extending in a third direction (a Z-axis direction), perpendicular to one surface of the substrate 301, and filling the trenches with a material such as polysilicon. A plurality of pixel regions PA arranged in the first direction and the second direction may be defined by the pixel isolation layer 305.

Figure 11:
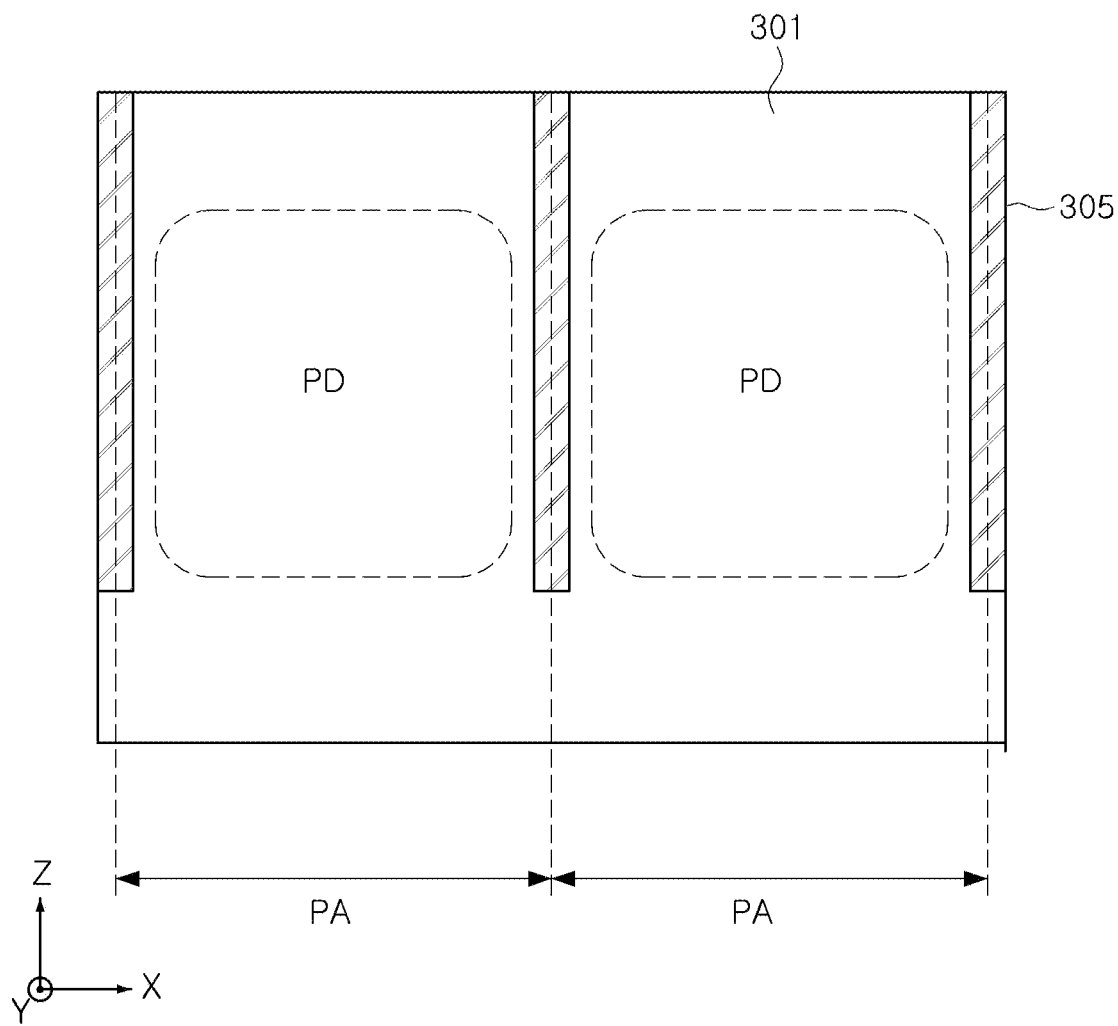

A photodiode PD may be formed in each of the plurality of pixel regions PA, as illustrated in FIG. 11. However, according to example embodiments, the photodiode PD may be replaced with another photoelectric conversion element. The photodiode PD may be formed by doping the substrate 301 with predetermined impurities. As an example, the photodiode PD may be formed at a predetermined depth from an upper surface of the substrate 301.

Figure 12:
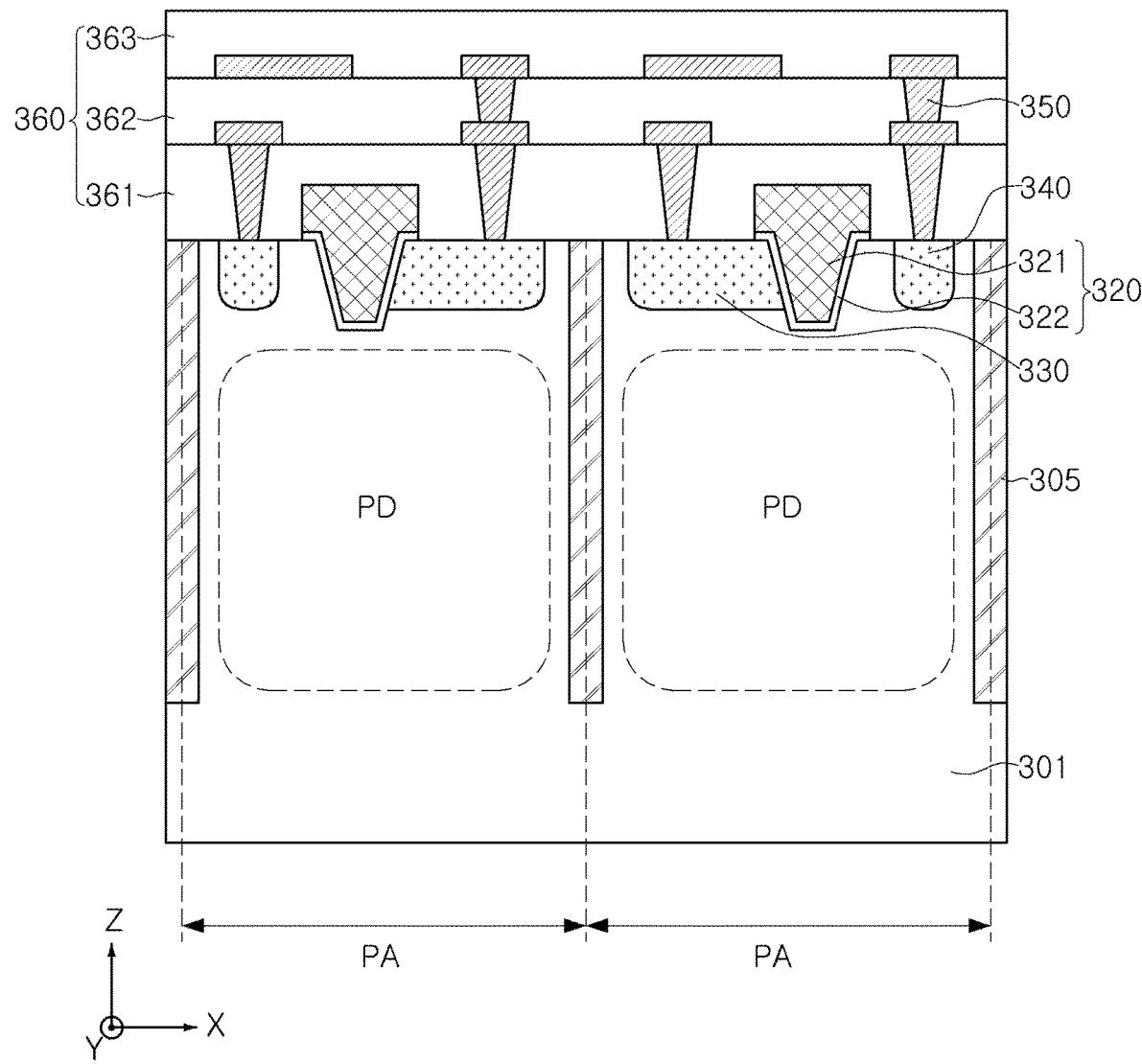

Referring to FIG. 12, a pixel circuit region may be formed. The pixel circuit region includes a transmission gate structure 320, a floating diffusion region 330, and an impurity region 340, formed in the substrate 301, interconnection patterns 350 and an interlayer insulating layer 360 formed on the substrate 301, and the like. According to example embodiments, the pixel circuit region may further include at least one transistor, other than the transmission gate structure 320, the floating diffusion region 330, and the impurity region 340. The interlayer insulating layer 360 may include a plurality of interlayer insulating layers 361, 362, 363. Elements, included in the pixel circuit region, may be connected to each other by the interconnection patterns 350 to provide a pixel circuit.

Figure 13:
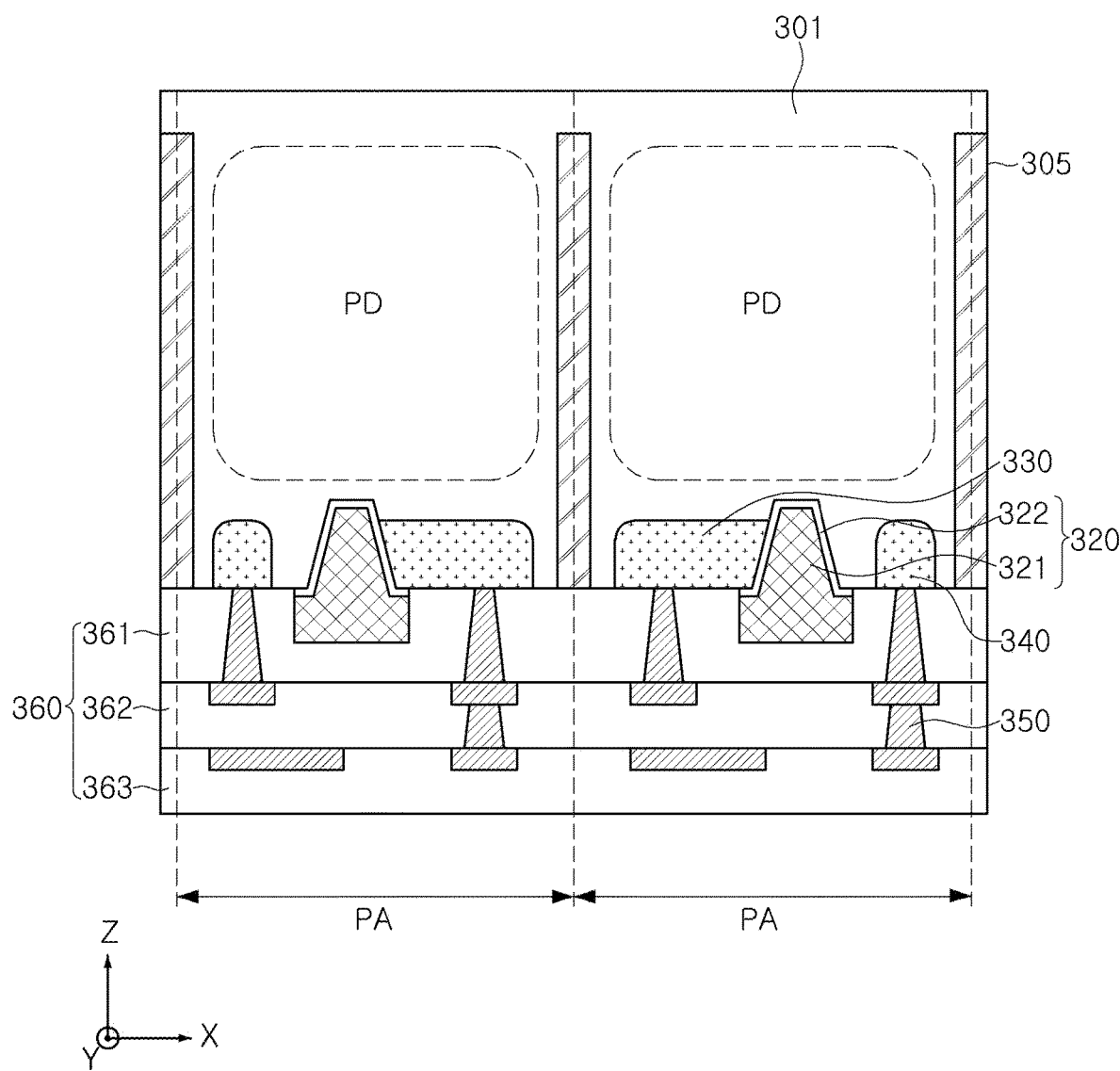
Figure 14:
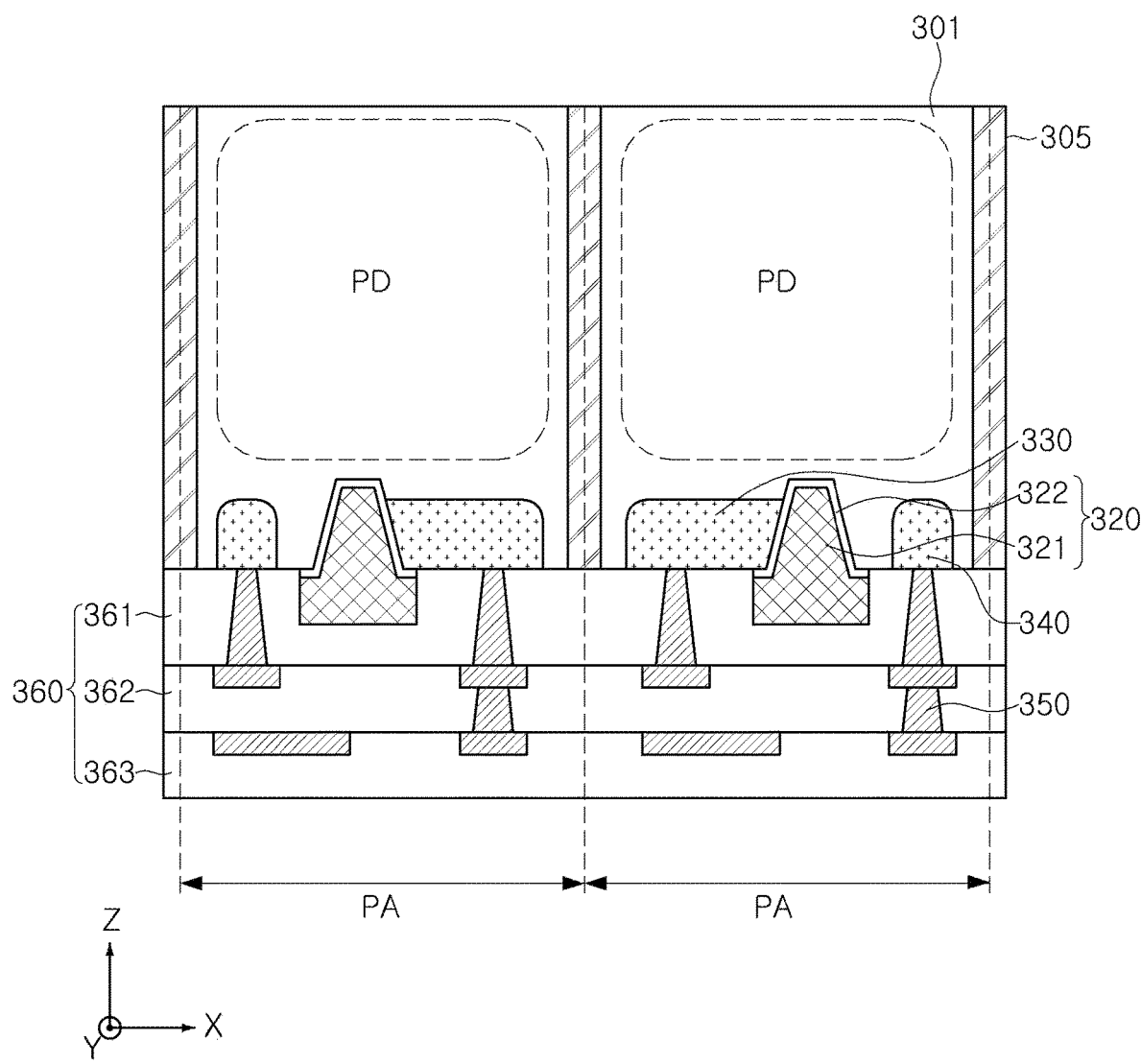

Referring to FIGS. 13 and 14, after turning over the substrate 301 in which the pixel circuit region is formed, a chemical-mechanical polishing (CMP) process may be performed to remove a portion of the substrate 301. As illustrated in FIGS. 13 and 14, a thickness of the substrate 301 may be reduced by the CMP process, and a distance between the photodiode PD and one surface of the substrate 301 may be reduced.

According to example embodiments, after the CMP process, the pixel isolation layer 305 may not be formed to completely penetrate through the substrate 301 as illustrated in FIG. 13, or the pixel isolation layer 305 may be formed to completely penetrate through the substrate 301 as illustrated in FIG. 14. For example, in the example embodiment illustrated in FIG. 14, a region of the substrate 301 may be removed by the CMP process, so that a first surface of the substrate 301 may be coplanar with the one surface of the pixel isolation layer 305. Accordingly, a thickness of the substrate 301 and a thickness of the pixel isolation layer 305 may be the same in the third direction.

Figure 15:
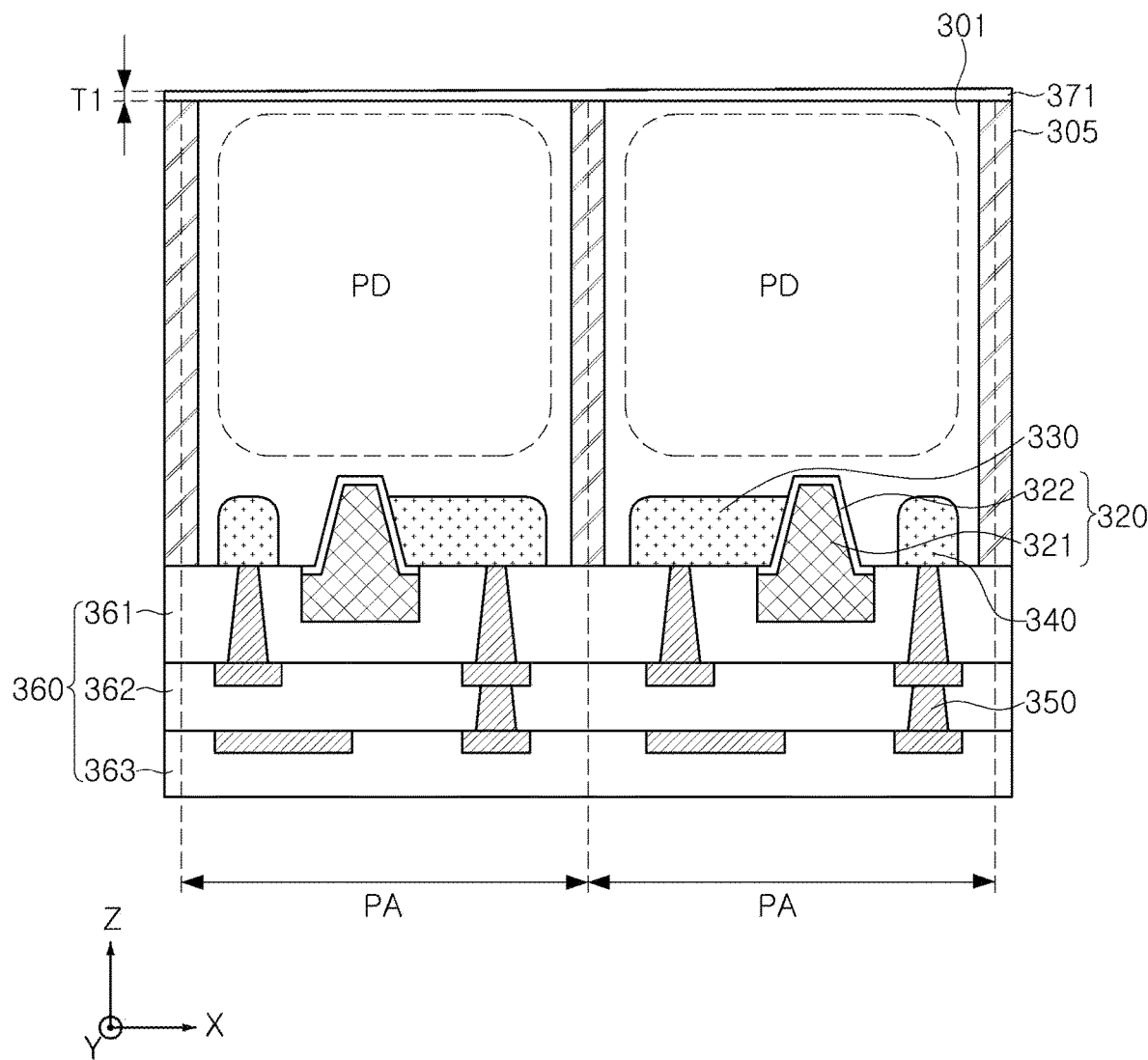

Referring to FIG. 15, a first insulating layer 371 may be formed on the first surface of the substrate 301. The first insulating layer 371 is formed to a first thickness T1. As an example, the first insulating layer 371 may have a thickness of 50 to 150 angstroms. The first insulating layer 371 may be formed of a high-K dielectric material, having a dielectric constant higher than that of silicon oxide, for example, aluminum oxide. The first insulating layer 371 may cure defects occurring in the substrate 301 due to a CMP process, or the like.

As an example, dangling bonds may be formed in the substrate 301 by a CMP process, or the like, to generate excess charges. The excess charges, generated by the dangling bonds, may not be distinguished from photocharges generated by the photodiode (PD) in response to light, so that dark level characteristics of an image sensor may be deteriorated and white spots may appear in the image. In an example embodiment, the first insulating layer 371 may be formed of a high-K dielectric material such as aluminum oxide to cure defects in the substrate 301, so that the dark level characteristics of the image sensor may be improved and occurrence of white spots may be significantly reduced.

Figure 16:
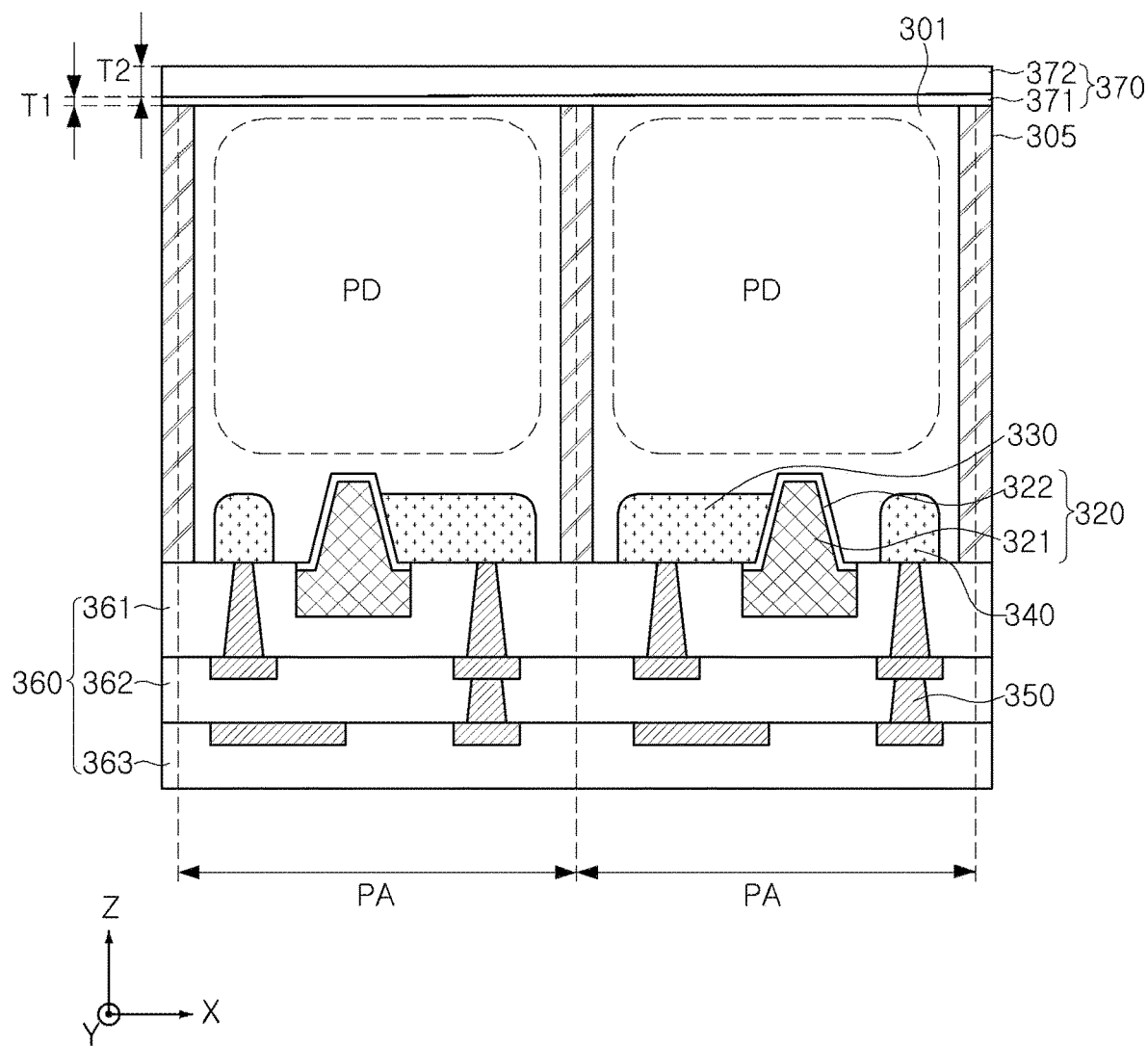

Referring to FIG. 16, a second insulating layer 372 may be formed on the first insulating layer 371. The second insulating layer 372 may be formed of a high-K dielectric material, different from that of the first insulating layer 371. For example, the second insulating layer 372 may be formed of hafnium oxide. The second insulating layer 372 may function as a type of a hard mask, and may reduce damage to the first insulating layer 371 in a subsequent process.

The second insulating layer 372 may be formed to have a second thickness T2 greater than the first thickness T1. As an example, the second thickness T2 may be greater than twice the first thickness T1, and may be several hundreds of angstroms. When the second insulating layer 372 is formed to have a thickness smaller than or equal to that of the first insulating layer 371, the second insulating layer 372 may be removed in an etching process, or the like, among subsequent processes, and the first insulating layer 371 may be damaged to cause degradation of the dark level of the image sensor and occurrence of white spots. Accordingly, the second insulating layer 372 may have a thickness greater than that of the first insulating layer 371.

Alternatively, according to example embodiments, a third insulating layer may be further formed on the second insulating layer 372. In this case, the third insulating layer may be formed to have a thickness smaller than the second thickness T2 of the second insulating layer 372, and may be formed of a high-K dielectric material, different from that of the second insulating layer 372. In an embodiment, the third insulating layer may be formed of the same high-K dielectric material as the first insulating layer. The third insulating layer may function as a type of a hard mask layer to protect the first insulating layer 371 and the second insulating layer 372.

Figure 17:
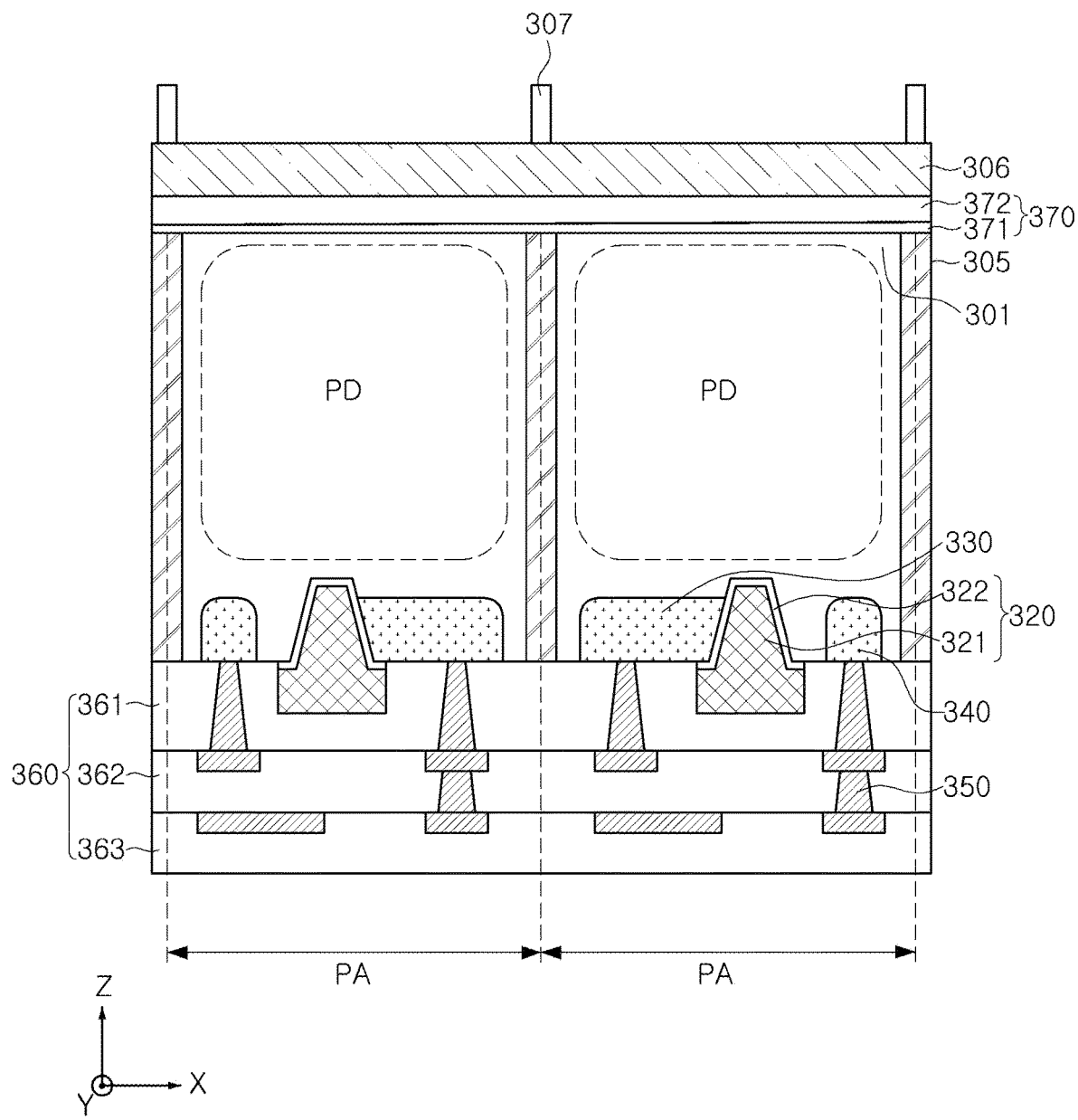

Referring to FIG. 17, a sacrificial layer 306 may be formed on a horizontal insulating layer 370 including the first insulating layer 371 and the second insulating layer 372, and a mask layer 307 may be formed on the sacrificial layer 306. As an example, the mask layer 307 may be formed in a position corresponding to the pixel isolation layer 305 in the first direction and the second direction, and the sacrificial layer 306 may be exposed in each of the plurality of pixel regions PA by the mask layer 307.

Figure 18:
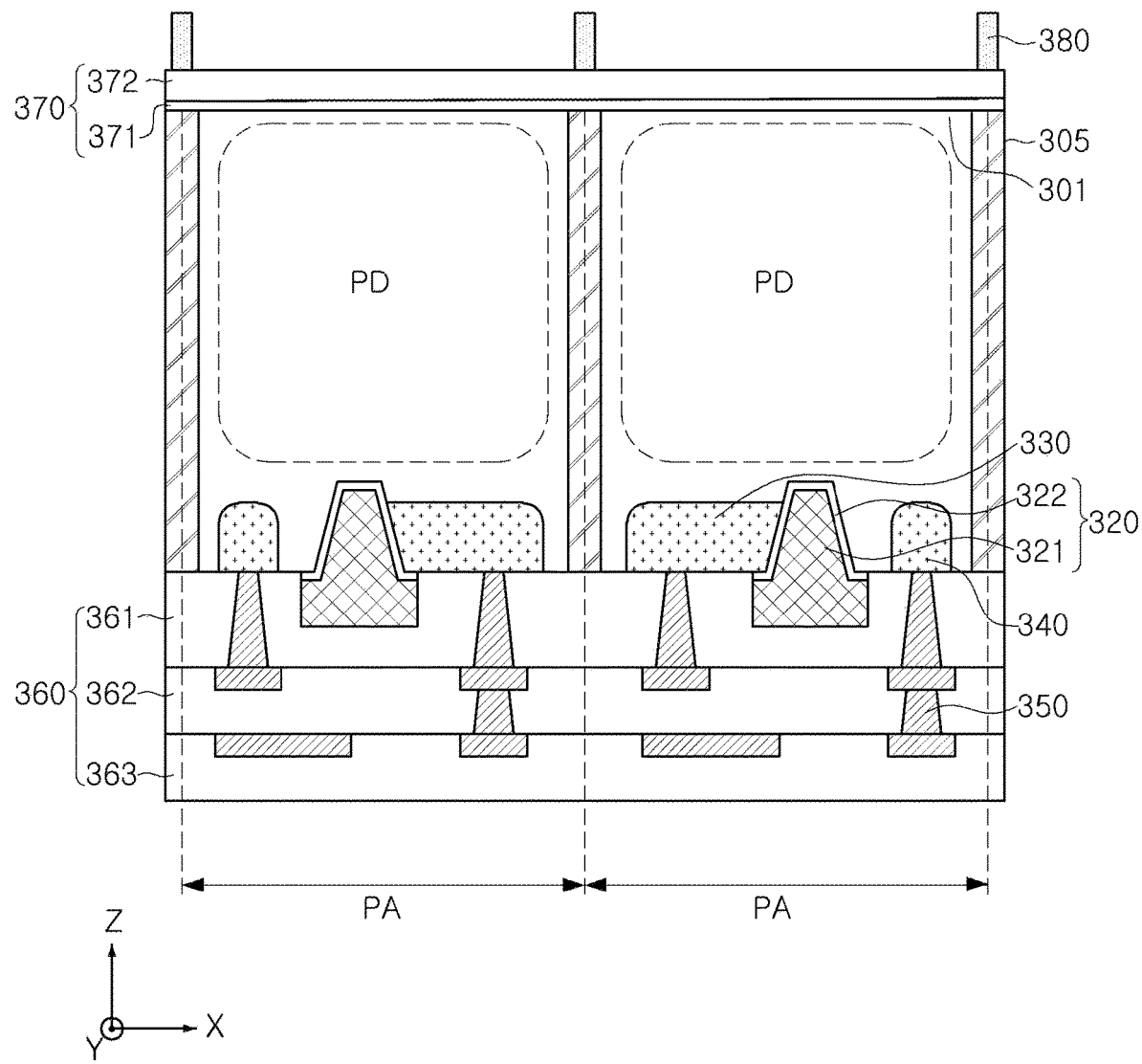

When the mask layer 307 is formed, an etching process of removing the sacrificial layer 306 in a region exposed by the mask layer 307 may be performed to form the filter isolation layer 380, as illustrated in FIG. 18. The filter isolation layer 380 may extend in the first direction and the second direction and may be formed in a position corresponding to the pixel isolation layer 305. In the example embodiment illustrated in FIG. 18, the filter isolation layer 380 is assumed to have a width smaller than that of the pixel isolation layer 305, but example embodiments are not limited thereto.

As illustrated in FIG. 18, a portion of the horizontal insulating layer 370 may be removed by an etching process during the etching process of removing the sacrificial layer 306. As described above, the second insulating layer 372 may be formed to have a thickness greater than that of the first insulating layer 371, so that even when a region of the sacrificial layer 306 is completely removed by the etching process, damage caused by the etching process may not extend to the first insulating layer 371.

During the etching process of forming the filter isolation layer 380, at least a portion of the second insulating layer 372 may be removed together with the sacrificial layer 306. In this case, a thickness of the second insulating layer 372 between the filter isolation layer 380 and the pixel isolation layer 305 may be greater than a thickness of the second insulating layer 372 in the other regions.

As described above, a third insulating layer may be further formed on the second insulating layer 372. In an example embodiment in which the third insulating layer is further formed, a portion of the third insulating layer may be removed together with the sacrificial layer 306. Alternatively, the entire third insulating layer may be removed together with the sacrificial layer 306. In this case, the third insulating layer may be present only between the filter isolation layer 380 and the pixel isolation layer 305.

Figure 19:
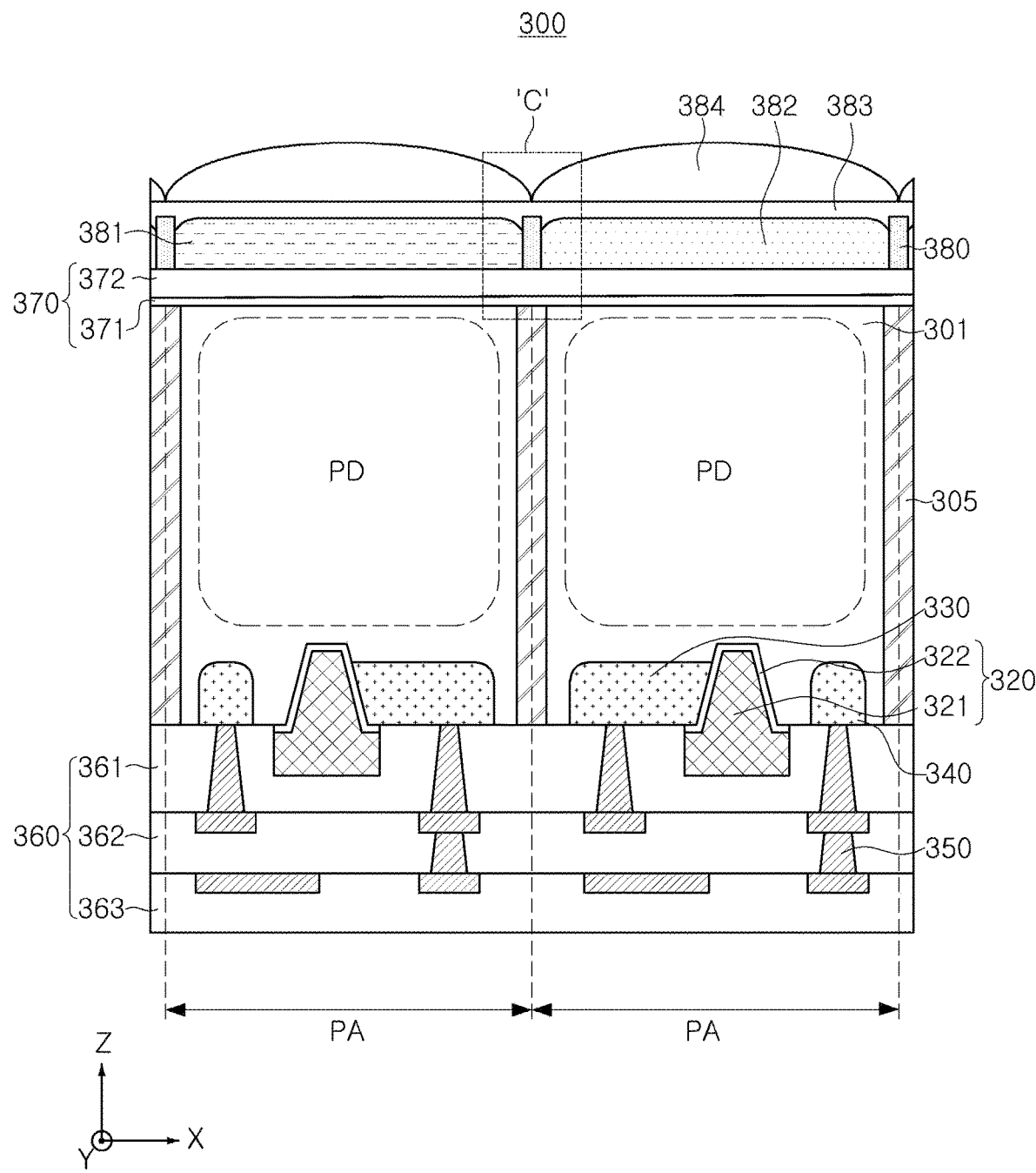

Referring to FIG. 19, color filters 381 and 382 may be formed between the filter separation films 380, and a planarization layer 383 and microlenses 384 may be formed on the color filters 381 and 382. In an operation of the related art image sensor, light passing through one of the color filters 381 and 382 may be incident on the photodiode PD disposed in each of the plurality of pixel regions PA, other than the photodiode PD of the one of the color filters 381 and 382. Accordingly, to improve the quality of an image generated by the image sensor 300, light passing through the color filter 381 of a first color, among the color filters 381 and 382, may not enter the photodiode PD disposed below the color filter 382 of a second color.

However, the horizontal insulating layer 370 is inevitably formed to cure defects occurring in the substrate 301 in the CMP process, or the like, so that when light is obliquely incident at an angle so as not to be parallel to the third direction, light passing through the color filter 381 of the first color may passes through the horizontal insulating layer 370 between the filter isolation layer 380 and the pixel isolation layer 305 to enter the photodiode PD below the color filter 382 of the second color. In this case, the photodiode PD below the color filter 382 of the second color may react with light of the first color and light of the second color to generate charges. As a result, the quality of the image may be deteriorated.

In an embodiment, the above problems are solved by simplifying a structure of the horizontal insulating layer 370, appropriately selecting a material of the horizontal insulating layer 370, and limiting a thickness thereof. Unlike a general case including layers formed of a high-K dielectric material as well as a silicon oxide layer having a thickness of several hundreds of angstroms, in an embodiment, the horizontal insulating layer 370 may be formed of only a high-K dielectric material, not including silicon, and the horizontal insulating layer 370 may be formed such that an overall thickness thereof does not exceed a maximum of 1000 angstroms. Accordingly, a distance between the filter isolation layer 380 and the pixel isolation layer 305 may be significantly reduced, and the amount of light passing through the horizontal insulating layer 370 between the filter isolation layer 380 and the pixel isolation layer 305 may also be reduced.

Figure 20:
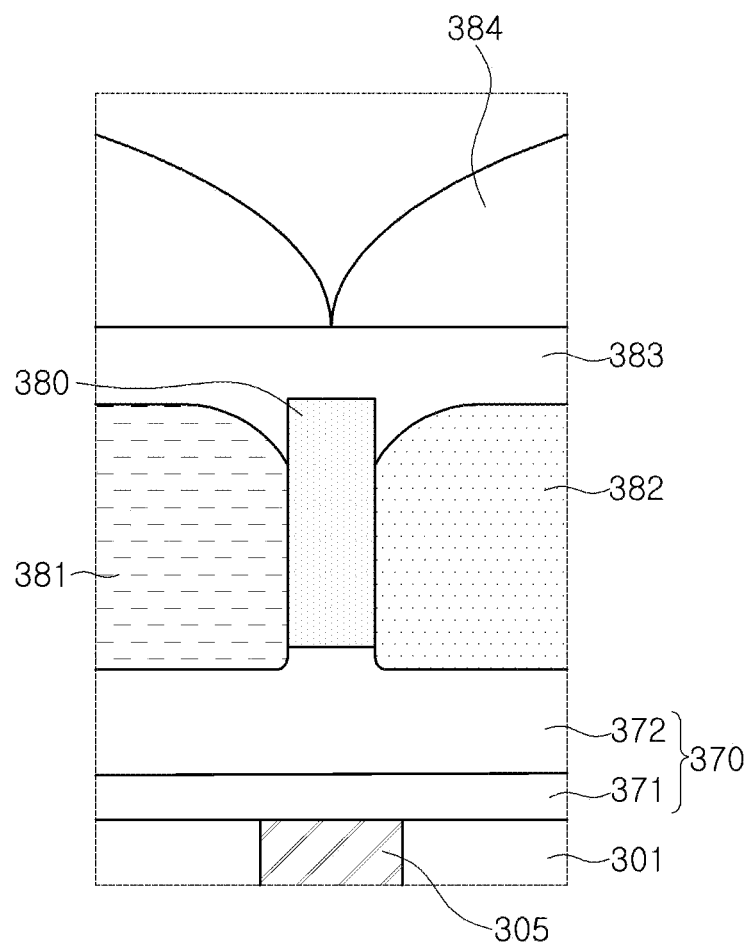
FIG. 20 is an enlarged view of region "C" of FIG. 19.

FIG. 20 is an enlarged view of region "C" of FIG. 19.

Referring to FIG. 20, the horizontal insulating layer 370 may be disposed between the filter isolation layer 380 and the pixel isolation layer 305 and between the color filters 381 and 382 and the substrate 301. The first insulating layer 371 of the horizontal insulating layer 370 may be in contact with the pixel isolation layer 305 and the substrate 301 therebelow, and the second insulating layer 372 may be in contact with the filter isolation layer 380 and the color filters 381 and 382 thereabove. A planarization layer 383 and microlenses 384 may be disposed on the color filters 381 and 382.

In the example embodiment illustrated in FIG. 20, the overall thickness of the horizontal insulating layer 370 may vary depending on a position. As an example, a thickness of the horizontal insulating layer 370 between the pixel isolation layer 305 and the filter isolation layer 380 may be greater than or equal to a thickness of the horizontal insulating layer 370 between the color filters 381 and 382 and the substrate 301. As described above, this may be a thickness difference caused by removal of a portion of the second insulating layer 372 of the horizontal insulating layer 370 during the etching process of forming the filter isolation layer 380.

However, the layer removed during the etching process of forming the filter isolation layer 380 may be the second insulating layer 372 of the horizontal insulating layer 370. Therefore, a thickness of the first insulating layer 371 between the pixel isolation layer 305 and the filter isolation layer 380 may be equal to a thickness of the first insulating layer 371 between the color filters 381 and 382 and the substrate 301. On the other hand, a thickness of the second insulating layer 372 between the pixel isolation layer 305 and the filter isolation layer 380 may be equal to a thickness of the second insulating layer 372 between the color filters 381 and 382 and the substrate 301.

In contrast, according to example embodiments, the thickness of the second insulating layer 372 between the pixel isolation layer 305 and the filter isolation layer 380 may be greater than the thickness of the second insulating layer 372 between the color filters 381 and 382 and the substrate 301. As an example, when the filter isolation layer 380 is formed by a process different from that of the embodiments described with reference to FIGS. 17 and 18, the thickness of the second insulating layer 372 may be changed as described above.

For example, the second insulating layer 372 may be formed and a mask layer may be formed on the second insulating layer 372 to expose only a region in which the filter isolation layer 380 is to be formed, and the filter isolation layer 380 may be formed in a space exposed by the mask layer and the mask layer may be removed. In the process of forming the mask layer to expose only the region in which the filter isolation layer 380 is to be formed, a thickness of a region of the second insulating layer 372 may be reduced and the filter isolation layer 380 may be formed on the region. Accordingly, the thickness of the second insulating layer 372 between the pixel isolation layer 305 and the filter isolation layer 380 may be greater than the thickness of the second insulating layer 372 between the color filters 381 and 382 and the substrate 301. However, this is only one example, and the second insulating layer 372 may be formed to have a relatively low thickness between the filter isolation layer 380 and the pixel isolation layer 305 by other various processes.

As described above, to suppress crosstalk between adjacent pixels, a horizontal insulating layer disposed between a semiconductor substrate and a color filter may be formed to have a thickness of 1000 angstroms or less and may be formed of only a high-K dielectric material for curing a semiconductor substrate. Accordingly, crosstalk, which is caused by a portion of light incident on a pixel entering other pixels, may be significantly suppressed and, at the same time, generation of white spots may be suppressed to improve a dark level.

While example embodiments have been shown and described above, it will be apparent to those skilled in the art that modifications and variations could be made without departing from the scope of the present inventive concept as defined by the appended claims.

What is claimed is:

1. An image sensor comprising:
   a substrate comprising a first surface and a second surface opposing the first surface;
   a first region comprising a first photodiode;
   a second region comprising a second photodiode;
   a first color filter on the first region;
   a second color filter on the second region;
   a first isolation layer between the first color filter and the second color filter;
   a second isolation layer separating the first region and the second region; and
   a horizontal insulating layer comprising a first insulating layer on the first and second regions and a second insulating layer stacked on the first insulating layer,
   wherein the first insulating layer is in direct contact with the second isolation layer,
   wherein a thickness of the horizontal insulating layer in a first direction is equal to or greater than 300 angstroms and equal to or less than 1,000 angstroms,
   wherein a thickness of the first insulating layer in the first direction is equal to or greater than 50 angstroms and equal to or less than 150 angstroms,
   wherein an upper surface of the second insulating layer is in direct contact with the first color filter, and a distance from the first insulating layer to the first isolation layer in the first direction is greater than a distance from the first insulating layer to the first color filter in the first direction, and
   wherein the first isolation layer is stacked on the horizontal insulating layer in the first direction.

2. The image sensor of claim 1, wherein the second insulating layer has a top surface and a bottom surface opposing the top surface,
   wherein a thickness of the second insulating layer from the bottom surface to the first color filter is smaller than a thickness of the second insulating from the bottom surface to the first isolation layer in the first direction, and
   wherein the top surface is in contact with the first color filter.

3. The image sensor of claim 2, wherein the horizontal insulating layer further includes a third insulating layer disposed between the first insulating layer and the second insulating layer.

4. The image sensor of claim 3, wherein a thickness of the third insulating layer in the first direction is different from the thickness of the first insulating layer in the first direction.

5. The image sensor of claim 4, wherein the thickness of the third insulating layer in the first direction is greater than the thickness of the first insulating layer in the first direction.

6. The image sensor of claim 5, wherein the first isolation layer is spaced apart from the second isolation layer in the first direction.

7. The image sensor of claim 6, wherein the thickness of the first insulating layer in the first direction is smaller than a half of the thickness of the third insulating layer in the first direction.

8. The image sensor of claim 7, wherein the first insulating layer comprises a first material and the second insulating layer comprises a second material different from the first material.

9. The image sensor of claim 8, wherein the second material is a high-K dielectric material.

10. An image sensor comprising:
    a substrate comprising a first surface and a second surface opposing the first surface;
    a first region comprising a first photodiode;
    a second region comprising a second photodiode;
    a first color filter on the first region;
    a second color filter on the second region;
    a first isolation layer between the first color filter and the second color filter;
    a second isolation layer separating the first region and the second region; and
    a horizontal insulating layer comprising a first insulating layer on the first and second regions, a second insulating layer, and a third insulating layer between the first insulating layer and the second insulating layer,
    wherein the first insulating layer is in direct contact with the second isolation layer,
    wherein a thickness of the horizontal insulating layer in a first direction is equal to or greater than 300 angstroms and equal to or less than 1,000 angstroms, wherein a thickness of the first insulating layer in the first direction is equal to or greater than 50 angstroms and equal to or less than 150 angstroms, wherein an upper surface of the second insulating layer is in direct contact with at least one of the first color filter and the second color filter, and a boundary surface between the second insulating layer and the at least one of the first color filter and the second color filter is disposed at a level equal to or lower than a level of a bottom surface of the first isolation layer, and wherein the first isolation layer is stacked on the horizontal insulating layer in the first direction.

11. The image sensor of claim 10, wherein the thickness of the first insulating layer in the first direction is different from a thickness of the third insulating layer in the first direction, and wherein the thickness of the first insulating layer in the first direction is different from a thickness of the second insulating layer between the first insulating layer and the first color filter in the first direction.

12. The image sensor of claim 11, wherein the horizontal insulating layer includes a first high-K dielectric material.

13. The image sensor of claim 11, wherein the first isolation layer is spaced apart from the second isolation layer in the first direction.

14. The image sensor of claim 13, wherein the first insulating layer comprises a first material and the second insulating layer comprises a second material different from the first material.

15. The image sensor of claim 14, wherein a width of the first isolation layer in a second direction is different from a width of the second isolation layer in the second direction perpendicular to the first direction.

16. The image sensor of claim 15, wherein the thickness of the first insulating layer in the first direction is smaller than a half of the thickness of the third insulating layer in the first direction.

17. The image sensor of claim 12, wherein the first high-K dielectric material is aluminum oxide.

18. The image sensor of claim 17, wherein the horizontal insulating layer further comprises a second high-K dielectric material different from the aluminum oxide.

19. An image sensor comprising:
a substrate comprising a first surface and a second surface opposing the first surface;
a first region comprising a first photodiode;
a second region comprising a second photodiode;
a first color filter on the first region;
a second color filter on the second region;
a first isolation layer between the first color filter and the second color filter;
a second isolation layer separating the first region and the second region; and
a horizontal insulating layer comprising a first insulating layer on the first and second regions, a second insulating layer, and a third insulating layer between the first insulating layer and the second insulating layer,
wherein the first insulating layer is in direct contact with the second isolation layer,
wherein a thickness of the horizontal insulating layer in a first direction is equal to or greater than 300 angstroms and equal to or less than 1,000 angstroms,
wherein an upper surface of the second insulating layer is in direct contact with the first color filter, and a distance from the first insulating layer to the first isolation layer in the first direction is greater than a distance from the first insulating layer to the first color filter in the first direction,
wherein the first isolation layer is stacked on the horizontal insulating layer in the first direction, and
wherein the horizontal insulating layer comprises a first high-K dielectric material and a second high-K dielectric material different from the first high-K dielectric material.

20. The image sensor of claim 19, wherein the thickness of the first insulating layer in the first direction is smaller than a half of the thickness of the third insulating layer in the first direction.

* * * * *